United States Patent [19]
Huang

[11] Patent Number: 5,568,395
[45] Date of Patent: Oct. 22, 1996

[54] MODELING AND ESTIMATING CROSSTALK NOISE AND DETECTING FALSE LOGIC

[75] Inventor: Tammy Huang, Fremont, Calif.

[73] Assignee: LSI Logic Corporation, Milpitas, Calif.

[21] Appl. No.: 268,920

[22] Filed: Jun. 29, 1994

[51] Int. Cl.⁶ .................................................. G06F 17/50
[52] U.S. Cl. ............................................ 364/489; 364/578
[58] Field of Search ...................................... 364/488, 489, 364/490, 578; 395/500

[56]         References Cited
         U.S. PATENT DOCUMENTS 5,198,986   3/1993  Ikeda et al. .............................. 364/489
5,202,841   4/1993  Tani ........................................ 364/491
5,243,547   9/1993  Tsai et al. ................................ 364/578
5,337,252   8/1994  Lac et al. ................................ 364/488
5,373,456  12/1994  Ferkinhoff et al. ...................... 364/578
5,446,674   8/1995  Ikeda et al. ............................. 364/489

Primary Examiner—Vincent N. Trans
Attorney, Agent, or Firm—Townsend & Townsend & Crew, LLP

[57]         ABSTRACT

A system for modeling and estimating crosstalk noise and detecting false logic is provided. The noise is caused by culprit signal nets that are in a switching state and affect a victim net which is in a non-switching (DC) steady state. This estimated noise is evaluated against a predetermined threshold to determine whether any false logic results in the victim net.

18 Claims, 14 Drawing Sheets

MODELING AND ESTIMATING CROSSTALK NOISE AND DETECTING FALSE LOGIC

BACKGROUND OF THE INVENTION

The present invention relates in general to computer aided circuit design, and in particular to a system for modeling and estimating crosstalk noise and detecting false logic.

In electrical circuits, crosstalk noise is generated when signal activity on one signal conductor network ("net") couples as noise to neighboring signal nets through parasitic capacitances. With the dramatic increase in VLSI chip gate counts and circuit density, crosstalk noise has become a critical issue when designing integrated circuits. Thus, it is important for a Computer Aided Design (CAD) tool to simulate and predict circuit behavior taking into account interference due to such noise.

Crosstalk noise, being capacitively coupled in nature, is most significant at the instant when the interfering sources (culprits) are fast switching, thereby coupling the signal waveforms to the victim via some parasitic coupling capacitance. This noise may sometimes cause false logic to occur.

Although SPICE circuit simulation may be used to evaluate crosstalk noise, such evaluation requires a considerable amount of time and processing power. Depending upon the complexity of the circuit analyzed and capacity of the CAD system used, SPICE crosstalk analysis might take weeks to complete. Accordingly, there is a need for an improved CAD tool capable of providing fast and reasonably accurate estimates of crosstalk noise.

SUMMARY OF THE INVENTION

A system for modeling and estimating crosstalk noise and detecting false logic is provided. The noise is caused by culprit signal nets that are in a switching state and affect a victim net which is in a non-switching (DC) steady state. This estimated noise is evaluated to determine whether any false logic results in the victim net.

Crosstalk noise is estimated based upon a particular circuit model. Use of this model enables crosstalk noise to be estimated within a fraction of the time required for SPICE simulations. Additionally, the accuracy of this model has demonstrated to be within 10% of SPICE simulations run on various circuit configurations. This accuracy is subject to change, however, dependent upon approximations made by the host CAD system during circuit simulation (i.e., victim resistance values, input ramp time, loading capacitance, etc.)

In one embodiment, the invention provides a CAD system for modeling and estimating crosstalk noise and detecting false logic. The system includes a user interface for entering circuit schematic information into the CAD system; this information defines circuit elements and a plurality of circuit nets. A victim signal net and culprit signal net are included within the plurality of circuit nets, this information being stored in a memory, coupled to the user interface. The system also includes a processor, coupled to the memory, for calculating peak crosstalk noise ($\hat{v}_{XTm}$) on the victim signal net generated by the culprit signal net, wherein the peak crosstalk noise is defined as:

$$\hat{V}_{XTm} = (V_{dd}) \frac{\tau_c}{\tau_T} \cdot \left( \frac{\tau_T}{\tau_i} \right)^{\frac{\tau_i}{\tau_i - \tau_T}}$$

when $\tau_i \tau_T$ is not equal to zero, and $$V_{XTm} = (V_{dd}) \frac{\tau_c}{\tau_T} \cdot e^{-1}$$

when $\tau_i - \tau_T$ is equal to zero, where $\tau_c = R_v C_{cm}$, $\tau_T = R_v (C_i + C_{cT})$ and where $\tau_i$ represents a time constant and $C_i$ represents an effective loading capacitance of the culprit signal net, $R_v$ represents an effective resistance and $C_v$ represents an effective loading capacitance of the victim signal net, $C_{cm}$ represents coupling capacitance between the victim signal net and the culprit signal net, $C_{cT}$ represents a sum of all coupling capacitance related to the victim signal net, and $V_{dd}$ is the power supply voltage. Should the calculated peak crosstalk noise exceed a previously-defined threshold value, the processor detects the occurrence of false logic.

In another embodiment the invention provides a method for detecting false logic in a signal net due to crosstalk noise including the steps of entering circuit schematic information into a CAD system; determining a coupling capacitance between pairs of signal nets included within the circuit schematic information, where the pairs of nets include a victim and a culprit signal net; calculating effective resistance and capacitance values for victim signal nets, and effective capacitance values for culprit signal nets; retrieving a selected effective resistance and a selected effective capacitance for a selected victim signal net; calculating time constants associated with a set of culprit signal nets capacitively coupled to the selected victim signal net; and calculating a total peak crosstalk noise on the selected victim signal net generated by said set of culprit signal nets, wherein peak crosstalk noise on the victim signal net caused by one culprit signal net included within said defined set of culprit signal nets is determined through a peak crosstalk relationship derived from the crosstalk noise model.

DESCRIPTION OF THE SPECIFIC EMBODIMENT

Contents

I. Computer Aided Circuit Design

II. Crosstalk Model

III. Crosstalk Estimation and False Logic Detection

I. Computer Aided Circuit Design

A. Overview

The system for modeling and estimating crosstalk noise and detecting false logic (i.e., the "crosstalk system") described herein is embodied in a computer aided design ("CAD") system for electronic circuit design. The CAD system performs a number of well-known functions including editing electronic schematics, simulating electronic designs using a behavioral hardware description language, importing and exporting design data, determining circuit layout and analyzing simulation results. The hardware simulation language employed may be, for example, VHDL (i.e., IEEE 1076–1987 Version) or Verilog.

The crosstalk system is implemented in the "C" programming language, and is operational on the SUN Microsystems, Inc., line of engineering workstations running SUN operating system version 4.0 or later.

The crosstalk system is designed to be computersystem independent, and requires minimal change to run on additional workstation platforms. It will be apparent to those having ordinary skill in the art that the crosstalk system could be readily applied in any one of a variety of programming languages and on any one of a variety of workstations without departing from the scope of the invention. The above-noted language/hardware are merely illustrative.

Figure 1:
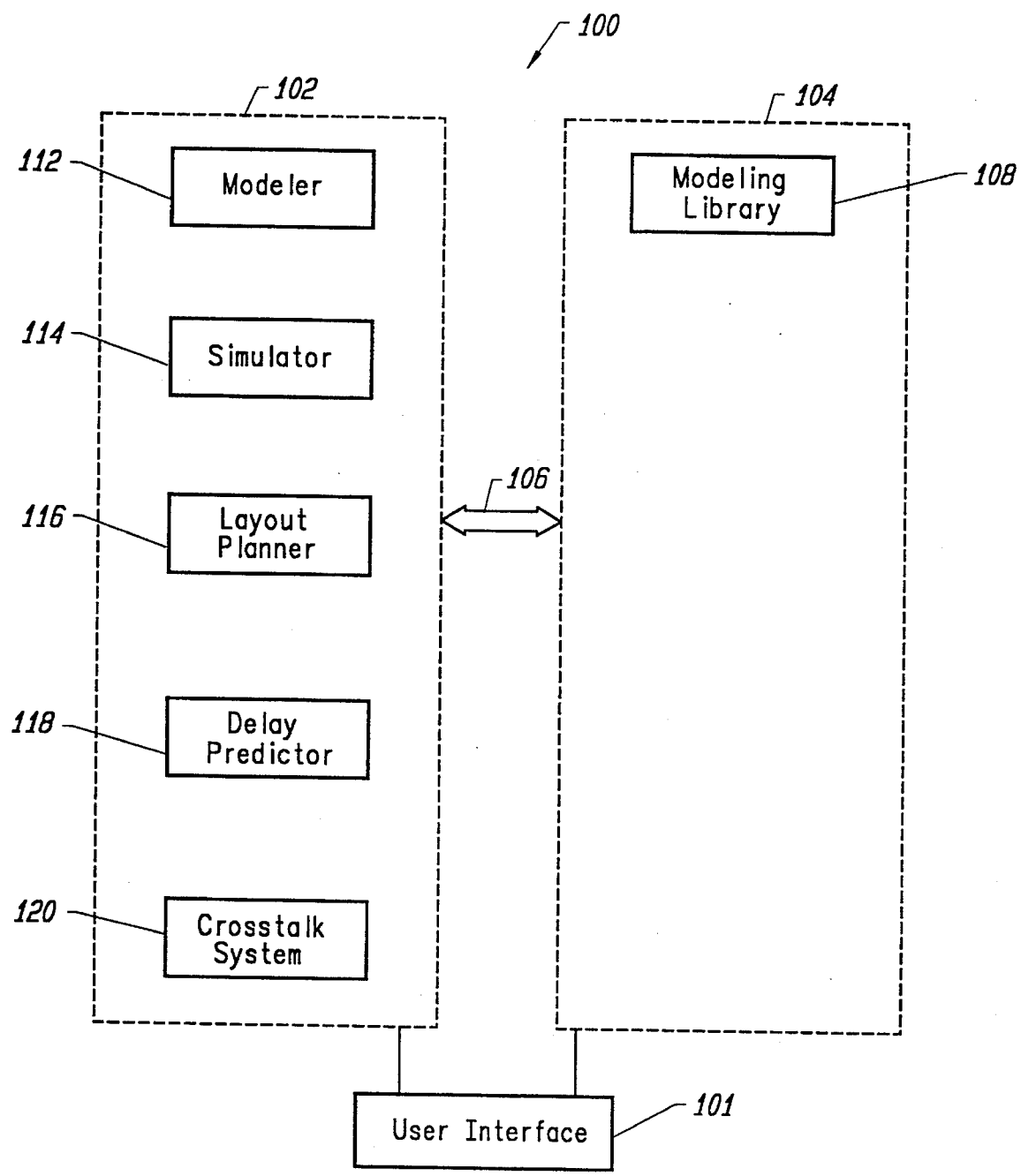
FIG. 1 is a block diagram of a general purpose digital computer configured to include a crosstalk system according to the principles of the invention.

FIG. 1 shows a simplified block diagram of CAD system 100 that includes the crosstalk system disclosed herein. In brief, the CAD system includes user interface 101 coupled to processing unit 102 and memory 104. The processing unit and memory communicate through interconnect 106, enabling the processing unit to gain access to circuit models held in modeling library 108 and circuit information held in memory 104. The CAD system may be used to create and test a circuit design and thereafter establish a circuit layout for fabrication in silicon as an application specific integrated circuit (ASIC).

Circuit schematic information representing a circuit design may be entered into CAD system 100 through user interface 101 via a schematic capture program. The schematic information, stored in memory 104, includes functional circuit elements (i.e., flip-flops, logical gates, etc.) and interconnecting signal nets. The circuit elements are represented by predesigned macrocells of varying complexity stored in modeling library 108, as shown in FIG. 1. Examples of such macrocells may be found in the following LSI Logic Corporation publications, which are incorporated herein by reference: *LEA300K Embedded Array®5 Volt ASIC Products Databook*, LSI Logic (October 1993), *LCB300K Cell-Based 5 Volt ASIC Products Databook*, LSI Logic (October 1993), and *LCA300K Gate Array 5 Volt Series Products Databook*, LSI Logic (October 1993).

Performance characteristics of macrocells are determined through modeler 112, which is an executable application running on processing unit 102 as shown in FIG. 1. This modeler creates two-dimensional tables for each macrocell associating signal delay and output resistance values with input signal ramp time and output capacitance loads. More specifically, modeler 112 performs a series of SPICE simulations on each macrocell with varying input ramp times (rising and falling) and output capacitance loads. The resulting output waveforms are curve fitted with first-order exponential curves (i.e., RC charge and discharge curves), defined by equations (1) and (2).

$$\text{macrocell output} = (1 - e^{-t/R_p C}) V_{dd} \quad (1)$$

$$\text{macrocell output} = (e^{-t/R_n C}) V_{dd} \quad (2)$$

Equation (1) is used to curve-fit output waveforms generated from rising input signals, while equation (2) is used to curve-fit output waveforms generated from falling input signals. The "C" in equations (1) and (2) represents the value of the effective loading capacitance hung off each macrocell during SPICE simulations. The rising and falling delays and associated output resistance values ($R_p$ and $R_n$, respectively) are derived from the RC curves using their respective input ramp times and loading parameters. As a result, a two-dimensional "look-up" table is created cataloging macrocell signal delays and output resistance values based upon a loading capacitance and input signal rise/fall time.

Functional (i.e., logic) simulation of the circuit design is performed by simulator 114, which is an executable application running on processing unit 102 as shown in FIG. 1. Logic simulators are well known by those having ordinary skill in the art, as illustrated by the simulation feature of LSI Logic Corporation's C-MDE Design System. Through appropriate selection of test vectors (i.e., circuit input), functionality of the circuit design may be verified.

Layout of the circuit design in a silicon environment (i.e., as part of an ASIC design process) is achieved through layout planner 116; an executable application running on processing unit 102, as shown in FIG. 1. Layout planner 116 establishes the placement of circuit elements and the routing of signal nets on a semiconductor chip. Typically, the layout planner may also contain optimization features for minimizing signal net length. After placement and routing are complete, the length of each wire segment contained in a signal net is computed and recorded.

Once circuit layout is established, electrical characteristics of a circuit (i.e., resistance and capacitance) and signal delay created by each circuit element and signal net contained in the layout is estimated by delay predictor 118; an executable application running on processing unit 102, as shown in FIG. 1. To determine delays caused by circuit elements, delay predictor 118 uses the two-dimensional look-up table created by modeler 112. Specifically, for each macrocell in the circuit design, delay predictor retrieves the capacitive load driven by the cell and the shape of the waveform into the cell from simulation data stored in memory 104. These two values are used to "look up" corresponding delay values in the table. Delay predictor will also perform any necessary interpolation or extrapolation when no table entry exactly matches the capacitive load and input waveform data present in the subject circuit design.

To determine signal net delays, delay predictor 118 will calculate, among other things, the wire capacitance of the net; i.e., the summation of the capacitance of each wire segment belonging to a net. Standard capacitance-to-ground values per unit of wire area are stored in modeling library 108. Delay predictor multiplies these values with previously calculated values of wire-segment length to determine capacitance of an individual wire. The capacitance of each wire is then summed to determine the net capacitance of the associated signal net.

Capacitive load present on the net is added to the foregoing net capacitance to determine "effective loading capacitance" used by the crosstalk system. With regards to signal nets affected by crosstalk noise (i.e., "victims"), the sum of the capacitance of all input pins belonging to a signal net (found in modeling library 108) would be an alternative and preferred method for estimating effective loading capacitance. In either case, the calculated loading capacitance is stored in memory 104.

Finally, crosstalk system 120, an executable application running on processing unit 102 as shown in FIG. 1, utilizes information from the foregoing applications to estimate crosstalk noise on select signal nets based on a model described below. Should this estimated noise be sufficiently large, a false logic is detected and the circuit design is returned to layout planner 116 to reroute the subject signal nets in order to eliminate the noise.

B. Process Flow

Figure 2:
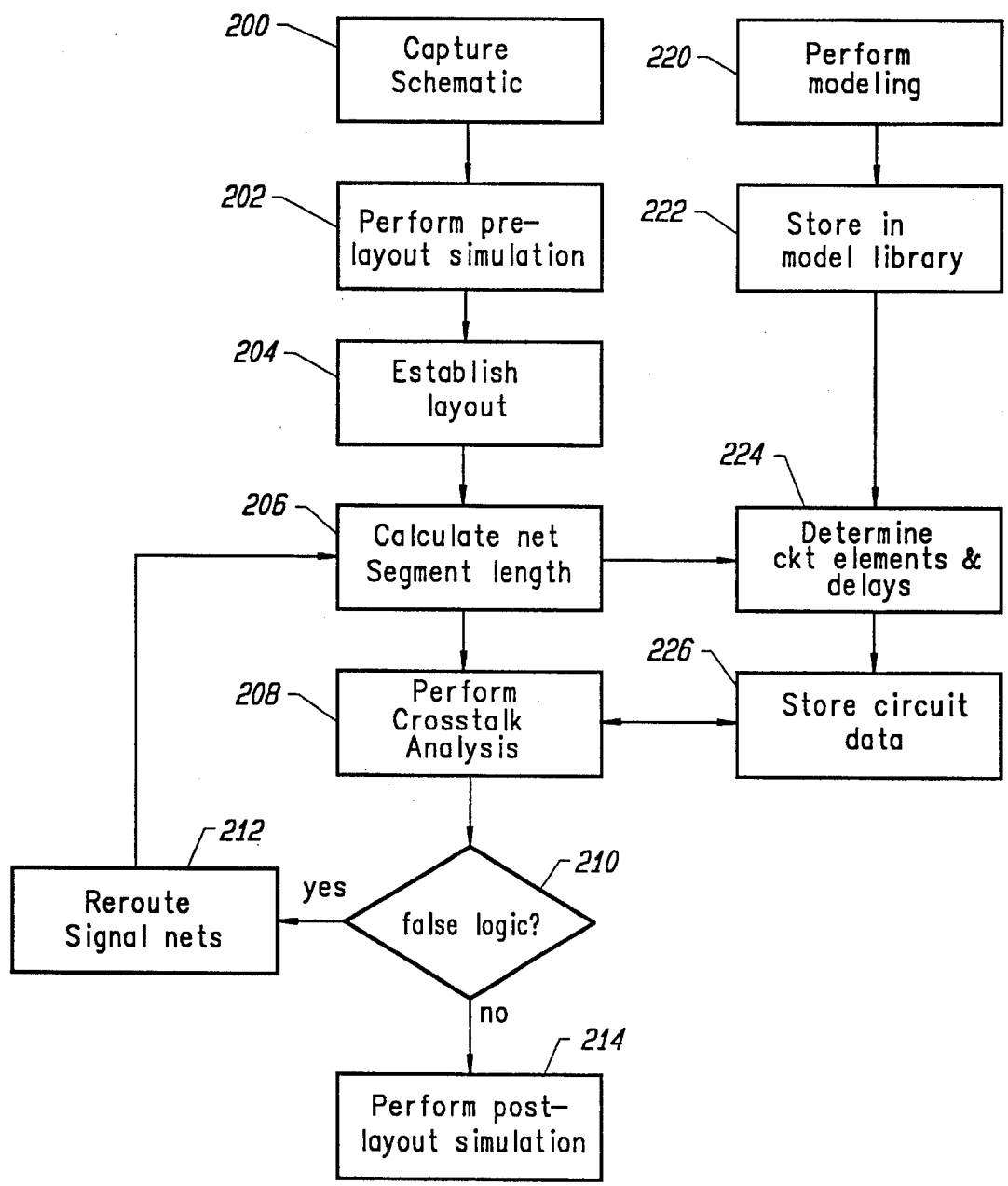
FIG. 2 is a flowchart of computer-aided circuit design operations performed on the general purpose digital computer of FIG. 1.

FIG. 2 illustrates a process flow of CAD system 100 incorporating a crosstalk system operating according to the principles of the invention. Initially, circuit-element modeling is performed in accordance with block 220 and resulting models are stored in a model library at block 222. Additionally, standardized values (i.e., capacitance-per-unit-length of wire, etc.) are stored in the model library at block 222. This modeling operation is completed prior to specific circuit design and simulation activities.

With circuit-element models in place, a circuit design is input into the CAD system via a schematic capture program at block 200. Although schematic capture is referenced in FIG. 2, any other known data-input means may be used to input a circuit design into the CAD system.

The functionality of the subject circuit design is evaluated during pre-layout logic simulation at block 202. Provided simulation is successful, the layout of the design is established at block 204. Following circuit layout, net segment length is calculated at block 206. Based upon segment length and previously-defined library values, the CAD system determines circuit capacitance, resistance and resulting signal delay in block 224. This information is stored in memory (i.e., memory 104 of FIG. 1) at block 226.

Drawing from the data stored in block 226, crosstalk analysis (i.e., modeling and estimating crosstalk and detecting false logic) is performed on the circuit design at block 208. The details of this analysis are provided below. Should any detected crosstalk result in false logic, the design is returned to block 206 via blocks 210 and 212 for re-routing of the affected signal nets. Otherwise, the circuit design undergoes post-layout simulation at block 214.

The foregoing process flow is merely exemplary; alterations will be apparent to those of ordinary skill in art. For example, crosstalk analysis may be performed after post-layout simulation.

II. Crosstalk Model

The crosstalk analysis described below estimates crosstalk noise caused by switching "culprit" signal net(s) on a non-switching (i.e., DC or steady-state) "victim" signal net. This estimated noise is then used to determine whether any false logic occurs on the victim.

A. Equivalent Circuit for Crosstalk Noise Analysis

Due to the MOS device nature of silicon technology, wires connecting nodes or components in a VLSI circuit exhibit distributed RC behavior. The circuit diagram of a distributed RC line with capacitive loading is shown in FIG. 3, wherein distributed resistors 302, distributed capacitors 304 and loading capacitor 306 are coupled to voltage source 300.

Figure 3:
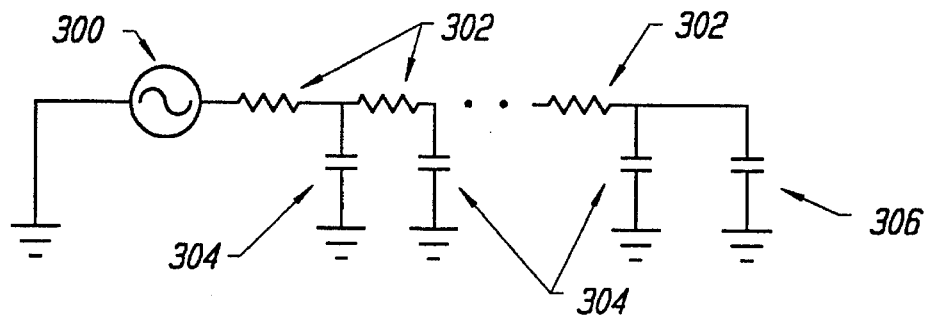
FIG. 3 illustrates a distributed RC line with capacitive loading.
Figure 4:
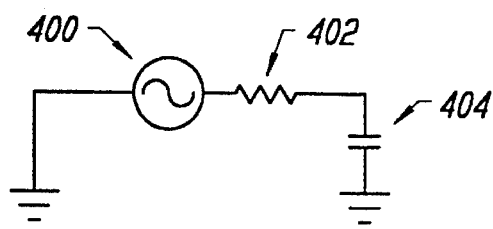
FIG. 4 illustrates a lumped RC model.

However, with a first-order approximation, the distributed resistors and capacitors of FIG. 3 can be simplified by lumped resistor 402 and lumped capacitor 404 shown in FIG. 4. Thus, the total impedance looking between two nodes of an MOS circuit is a sum of the wire impedance and the impedance of the elements between these two nodes.

Figure 5:
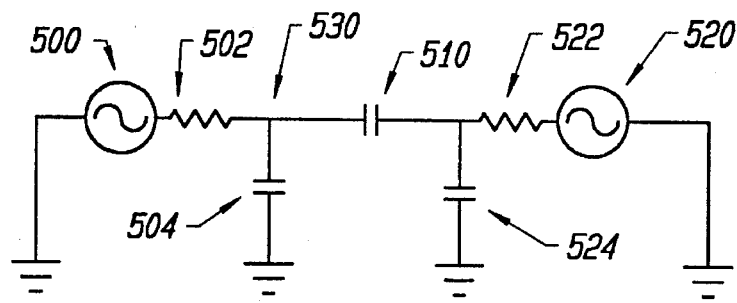
FIG. 5 illustrates a culprit net capacitively coupled to a victim net.

Using this lumped RC approximation, a victim net interfered by one nearby culprit net through a coupling capacitance ($C_c$) can be modeled as shown in FIG. 5. Referring to this figure, resistor 502 connected to culprit voltage source 500 ($V_i$) represents the effective resistance ($R_i$) of the culprit net. Similarly, resistor 522 connected to victim voltage source 520 ($V_v$) represents the effective resistance ($R_v$) of the victim net. Capacitors 504 and 524 represent effective loading capacitances of the culprit and victim nets, respectively ($C_i$ and $C_v$). Finally, capacitor 510 represents the coupling capacitance ($C_c$) and $V_{dd}$ (not shown) represents the power supply voltage.

Typically, the victim is a metal line connected to the output of a gate. $R_v$, in such cases, is equal to the sum of the line resistance and the effective channel resistance between the drain and the source of either an n-channel or p-channel MOS transistor, depending on whether the victim is in a low state or a high state at the time when the crosstalk interference occurs. More discussions on the $R_i$ and $R_v$ resistance values is provided below.

Since $C_c$ is typically much smaller than $C_i$, to find the culprit voltage waveform $v_x(t)$ at node 530, one can ignore the effect of the victim on the culprit voltage. Accordingly, $V_x(s)$, the Laplace transform of $v_x(t)$, may be determined in accordance with equation (3).

$$V_x(s) \approx V_i(s) \cdot \frac{1}{1 + sR_iC_i} \quad (3)$$

The following discussion assumes the input to the culprit has a low-to-high transition, and the victim is in a low state. However, the results derived are equally applicable to other cases (e.g., victim in high state, or culprit's input has a high-to-low transition).

For a step input voltage, $V_i(s)$ (i.e., from voltage source 500) is equal to $$\frac{V_{dd}}{s},$$

and the culprit voltage waveform in the time domain is shown in equation (4).

$$v_x(t) = V_{dd}(1 - e^{-t/(R_iC_i)}) \quad (4)$$

Figure 6:
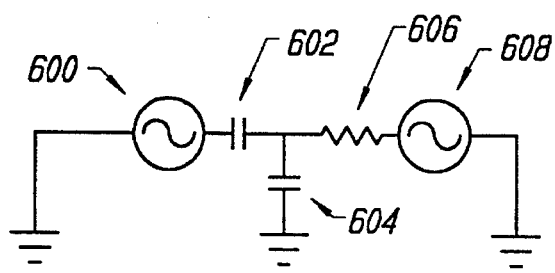
FIG. 6 illustrates a simplified circuit model of a one-culprit configuration.

Therefore, an effective crosstalk model of a single culprit is as shown in FIG. 6, including culprit voltage source 600 connected to coupling capacitance 602 which is, in turn, connected to effective resistance 606 and effective loading capacitance 604 of the victim net. Effective resistance 606 is also connected to victim voltage source 608.

Figure 7:
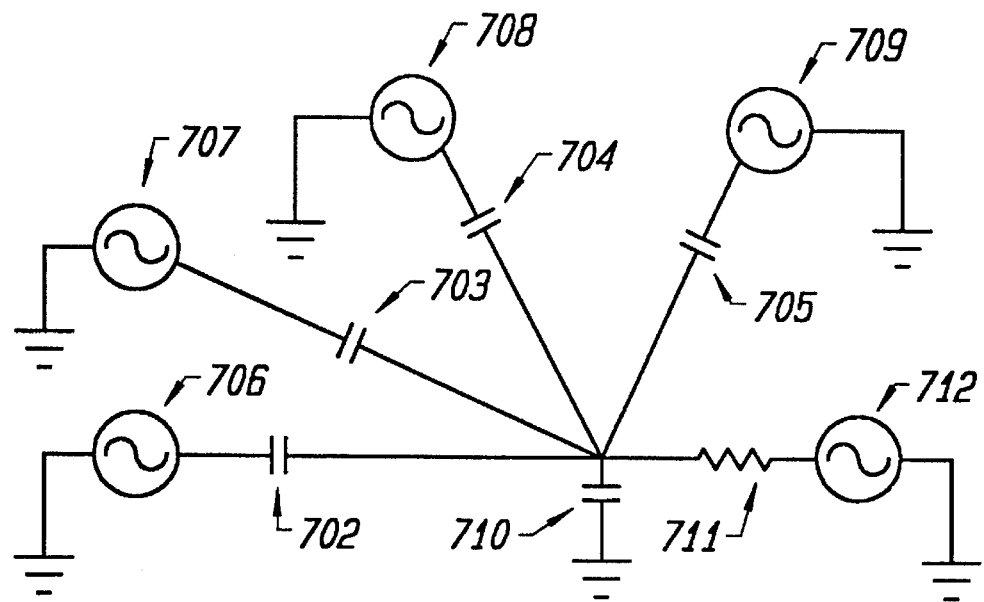
FIG. 7 illustrates a circuit model of a multiple-culprit configuration.

With multiple culprits, one can find each coupling capacitance ($C_{cm}$) and compute each associated culprit voltage waveform ($v_{xm}(t)$). The equivalent circuit model is then given in FIG. 7, wherein coupling capacitances 702–705 ($C_{c1}$, $C_{c2}$, $C_{c3}$ and $C_{cN}$) couple culprit voltage waveforms 706–709 ($v_{x1}(t)$, $v_{x2}(t)$, $v_{x3}(t)$ and $v_{xN}(t)$), respectively, with effective loading capacitance 710 and effective resistance 711 of a victim net ($C_v$ and $R_v$, respectively). Victim voltage source 712 is connected to effective resistance 711.

Figure 8:
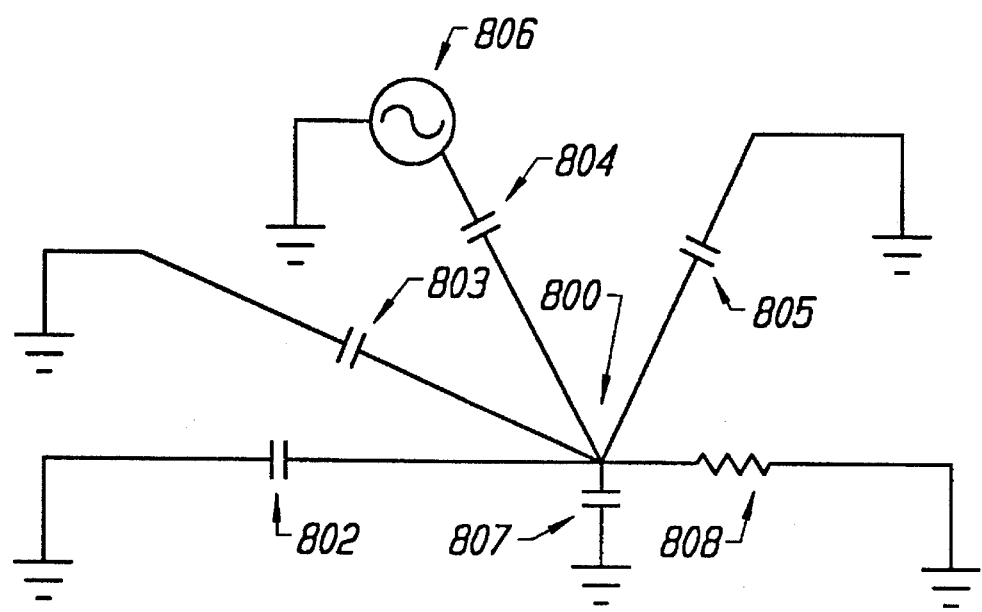
FIG. 8 illustrates noise contribution of a single culprit in a multiple culprit environment.

To find the total crosstalk noise to the victim, the crosstalk noise contributed by each culprit is first computed, and then the total noise is calculated by using the superposition principle. For example, the noise appearing at node 800 of FIG. 8 ($v_{XTm}(t)$) generated by culprit voltage waveform 806 (the $m^{th}$ culprit; $v_{xm}(t)$) can be computed based on the circuit model shown in FIG. 8, wherein coupling capacitance 804 ($C_{cm}$) couples waveform 806 with effective loading capacitance 807 and effective resistance 808 of a victim net ($C_v$ and $R_v$, respectively). Remaining coupling capacitances are shown as 802, 803 and 805 ($C_{c1}$, $C_{c2}$ and $C_{cN}$). Once $v_{XTm}(t)$ for each culprit voltage waveform is calculated ($v_{x1}(t)$, $v_{x2}(t)$ and $v_{xN}(t)$), the total crosstalk noise $v_{XTtotal}(t)$ can be determined based on equation (5).

$$v_{XTtotal}(t) = \sum_{m=1}^{N} v_{XTm}(t) \quad (5)$$

B. Victim Resistance ($R_v$)

As mentioned above, the victim resistance $R_v$ for a metal line connected to the output of a CMOS gate is equal to the sum of the line resistance and the output resistance of the gate; the latter being equal to the drain-to-source resistance of either an n-channel or p-channel MOS transistor.

Figure 9:
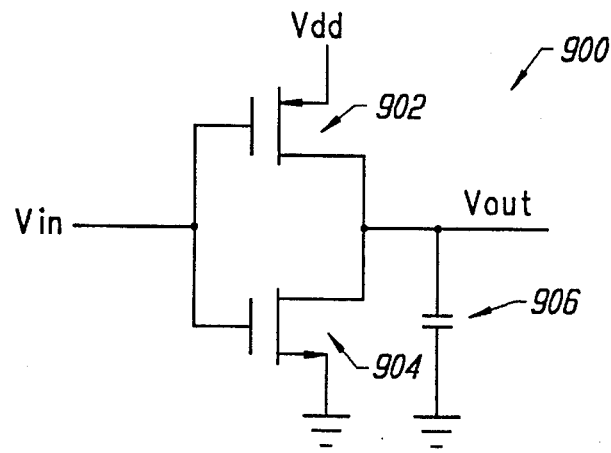
FIG. 9 illustrates a CMOS inverter.

FIG. 9 is a diagram of CMOS inverter 900. In the steady state, one of the transistors will be off (having almost infinite resistance), leaving the output connected to either $V_{dd}$ through p-channel transistor 902 or ground through n-channel transistor 904. The drain to source voltage $V_{DS}$ of the on transistor is almost zero in the steady state.

In this state, the transistor is in the so-called linear region, and the I–V characteristics of the transistor can be described by equations (6) and (7).

$$I_D = \frac{k'}{2} \frac{W}{L} \{2(V_{GS} - V_T)V_{DS} - V_{DS}^2\} \quad (6)$$

$$k' = \mu C_{ox} \quad (7)$$

In the foregoing equations, k' is a constant for a given process (k' of n-channel transistors is different from that of p-channel transistors due to the difference in the mobility μ).

Since this analysis is directed to the situation where $V_{DS}$ is very close to zero, equation (6) can be simplified to equation (8).

$$I_D = \frac{k'}{2} \frac{W}{L} \{2(V_{GS} - V_T)V_{DS}\} \quad (8)$$

Equation (8) describes a linear relationship-between the current and the voltage, and therefore describes a resistive behavior. Notice that $V_T$ is fixed for a given process and a fixed source to body voltage ($V_{SB}=0$). Thus, the resistance can be described by equations (9) and (10).

$$R = \left( k'' \frac{W}{L} \right)^{-1} \quad (9)$$

$$k'' = k'(V_{GS} - V_T) = \mu C_{ox}(V_{GS} - V_T) \quad (10)$$

In the foregoing equations, k" is a constant. The victim resistance is therefore only a function of the channel width/length ratio (i.e., W/L).

Figure 10:
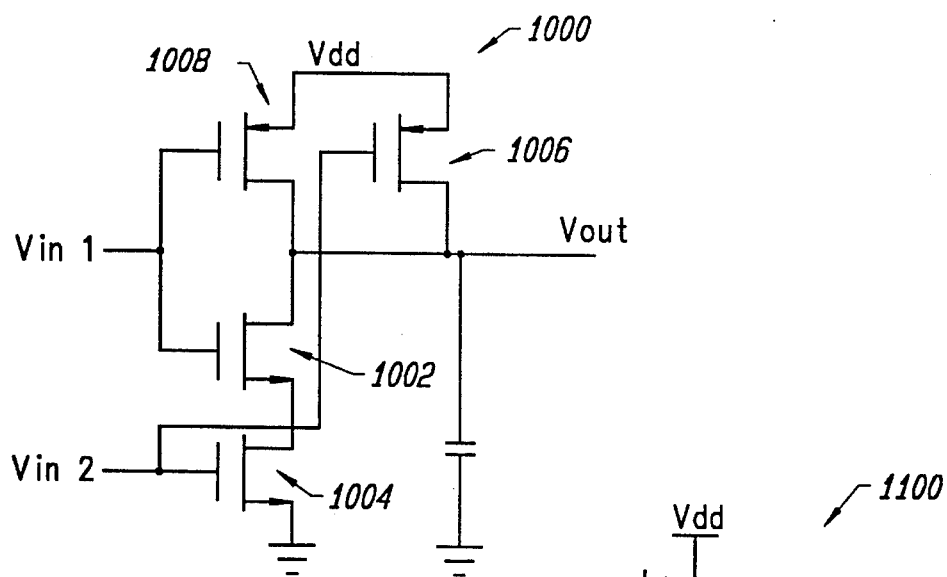
FIG. 10 illustrates a NAND gate.
Figure 11:
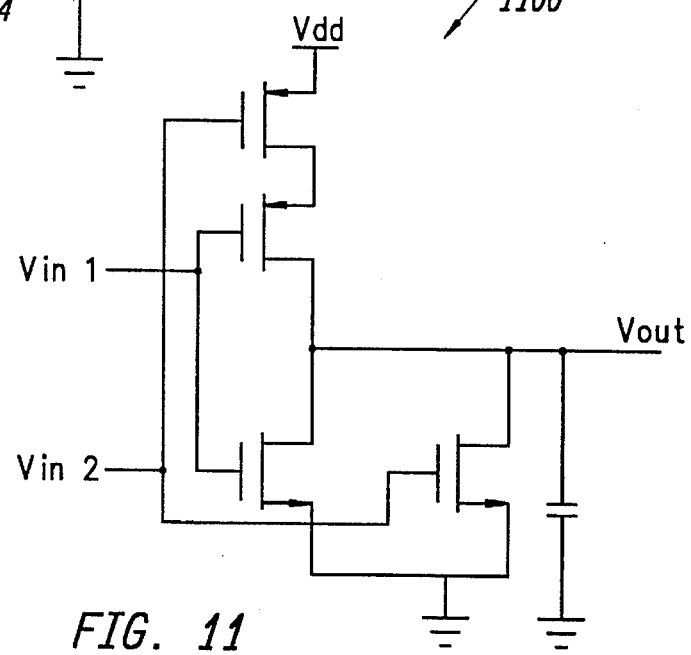
FIG. 11 illustrates a NOR gate.

For a more general cell, the last stage can be a combination of gates or transistors in series or parallel. FIGS. 10 and 11 illustrate circuit diagrams of NAND gate 1000 and NOR gate 1100, respectively. The DC resistance can be the resistance of two transistors in series, in parallel, or the resistance of any one of the transistors depending on the type of the gate and its input state. For example, when the output of NAND gate 1000 is in the low state (ground), the resistance is equal to the resistance of n channel transistors 1002 and 1004 in series. When the output of this NAND gate is in the high state ($V_{dd}$), the resistance can be equal to the resistance of any one of the p channel transistors (i.e., transistors 1006 and 1008), or the resistance of the two p-channel transistors in parallel depending on whether only one of the inputs are low or both of them are low. Notice that in the steady state (DC), the $V_{DS}$ of the transistor, if it is on, is always zero regardless whether there is another transistor in series or in parallel with it. Thus, the resistance equation given earlier still applies. One can determine the equivalent W/L first and then compute the equivalent resistance. The effective W/L for two transistors in series is given in equation (11).

$$\left( \frac{W}{L} \right)_{eff} = \frac{1}{\left( \frac{L}{W} \right)_1 + \left( \frac{L}{W} \right)_2} \quad (11)$$

And the effective W/L for two transistors in parallel is given in equation (12).

$$\left( \frac{W}{L} \right)_{eff} = \left( \frac{W}{L} \right)_1 + \left( \frac{W}{L} \right)_2 \quad (12)$$

In order for the path of two transistors in series to be active, both transistors must be on. Therefore, the resistance is always equal to the sum of the two. When two transistors are in parallel, however, the path can be active when both of them are on, or only one of them is on. If the exact state is not known, a worst case scenario should be assumed in the crosstalk estimation, i.e., the assumption should be that only one transistor is on. This will provide a larger victim resistance than if both are on and, therefore, a more pessimistic estimate of the crosstalk interference.

As the foregoing illustrates, effective victim resistance need only be a function of W/L information. Assuming the victim is a metal line connected to the output of a gate as described above, effective victim resistance will be the summation of the metal line resistance with the output of equation (9). Alternatively, SPICE simulations may be run to obtain D.C. resistance values of each victim net.

In addition, where W/L information is unavailable and the time delay associated with SPICE simulation is unacceptable, the effective DC resistance of a victim signal line or net (i.e., $R_v$) may be approximated by multiplying specific macrocell resistance values (i.e., $R_p$ or $R_n$) contained in a modeling library with an empirical scaling factor (i.e., $K_p$ or $K_n$), as shown in equations (13) and (14). The approximation generated by these equations are less accurate than the values generated by equation (9) or SPICE.

$$R_{vp} = K_p(R_p') \quad (13)$$

$$R_{vn} = K_n(R_n') \quad (14)$$

Equations (13) and (14) represent the effective resistance for a victim signal net coupled to a p-channel and n-channel transistor, respectively. As discussed above, model resistance values may be obtained by curve-fitting SPICE simulation outputs with exponential curves for given loading capacitances and input waveforms. The resistance values chosen (i.e., $R_p'$ or $R_n'$) are those corresponding to the smallest input ramp time and the largest loading fanout for each macrocell at issue. (Such resistance values have the smallest margin of error.) The scaling factors are calculated from a series of resistance values determined from DC and AC circuit simulation of generic macrocells in SPICE; such SPICE simulation being run prior to specific circuit design and simulation activities. More specifically, each scaling factor represents an average ratio of DC to AC resistance values calculated in SPICE for a particular macrocell. To approximate DC resistance values, these scaling factors are multiplied by AC values contained in a model library, such as library 108 of FIG. 1.

The empirical scaling factors will vary based on the particular "technology" being used. A technology is defined by the characteristics of a given process; i.e., HCMOS, CMOS, etc. Any change in this process (i.e., wire width, number of metal layers, etc.) represents a different technology.

Whether calculated from W/L information, derived from SPICE simulation or approximated with empirical scaling factors, the resulting effective resistance values for victim signal nets are stored in memory 104. Such calculation and memory storage is carried out by an application program, such as delay predictor 118 of FIG. 1.

C. Culprit Resistance ($R_i$)

The main difference between the victim resistance $R_v$ and the culprit resistance $R_i$ is that $R_v$ is the DC resistance of a transistor with $V_{DS}=0$, while $R_i$ is the effective transient resistance when the transistor is switching. While the DC resistance $R_v$ can be reasonably described by the equation given earlier, the transient resistance is quite complicated and is dependent upon the switching speed of the input as well as the loading capacitance.

When the input of a CMOS switches from one state to the other, the two transistors will each go through three regions: cutoff, saturation, and linear. For example, when the input of a CMOS inverter goes from low to high, the n-channel transistor, originally in the cutoff region, will enter the saturation region, and ultimately arrive in the linear region. The p-channel transistor, on the other hand, starts in the linear region, then may or may not go through the saturation region, and finally gets into the cutoff region where the transistor behaves as an open circuit. The length of the period during which the p-channel transistor is in the saturation region depends on how fast the input switches. In the extreme case, one can assume that the p-channel goes into cutoff region from linear region immediately after its channel charges get discharged. Ignoring the contribution of the p-channel charges, the output fall time in this case is determined mostly by how the charges on the loading capacitor get discharged through the n-channel transistor. The n-channel transistor starts off with a current characterized by the saturation region I–V relationship described in equation (15).

$$I_D = \frac{k'}{2} \frac{W}{L} (V_{GS} - V_T)^2 (1 + \lambda V_{DS}) \quad (15)$$

In the foregoing equation, $\lambda$ is the channel length modulation index describing the channel length modulation phenomenon. If we ignore the channel length modulation effect (assuming that $\lambda$ is zero), then the drain current is basically fixed and is independent of the drain-source voltage. It will remain in this region until a point when the drain-source voltage falls below $V_{GS}-V_T$. The duration which the transistor stays in this region depends on the loading capacitance. The larger the capacitance is, the slower the output voltage drops, and the longer the transistor stays in this region. Once the transistor goes into the linear region, we can again use the linear I–V relationship described in equation (6). Thus, for CMOS inverter 900 driving loading capacitor 906 shown in FIG. 9, equations (16) and (17) describe the dynamics of the system.

$$-C \frac{dV_{DS}}{dt} = \frac{k'}{2} \frac{W}{L} (V_{GS} - V_T)^2 (1 + \lambda V_{DS}) \quad (16)$$

when $V_{DS} \geq V_{GS}-V_T$, and $$-C \frac{dV_{DS}}{dt} = \frac{k'}{2} \frac{W}{L} \{2(V_{GS}-V_T)V_{DS} - V_{DS}^2\} \quad (17)$$

when $V_{DS<VGS}-V_T$.

From the foregoing discussion, it is clear that the equivalent culprit resistor is time varying, and is associated with the drain-to-source resistor of a transistor in two operating regions. When the transistor is in the saturation region, the culprit resistor is very large (inversely proportional to the channel length modulation index $\lambda$) and the system waveform is nearly a linear function of time. (A more detailed analysis shows that the system exhibits an offset exponential decay waveform with very long time constant.) When the transistor enters the linear region, the resistor is smaller and the waveform resembles that of a first order RC system.

To simplify the computation and yet retain sufficient accuracy, the entire transient response can be approximated with a first order RC exponential decay curve. For a given macrocell library, such as library 108 shown in FIG. 1, this process can be done ahead of time with curve-fitting results stored in the library accessible by a simulation program. Thus, no additional run-time computation is required in the circuit simulation stage. With this approximation, the equivalent exponential waveform of the culprit and its resistor value obtained through an RC curve-fitting process, such as described above with respect to modeler 112, can then be used to estimate the crosstalk noise as described above.

More specifically, since the culprit signal net is operating under AC conditions (i.e., a culprit voltage source is switching state—thereby creating a source of crosstalk noise), an effective resistance value (i.e., $R_i$) may be estimated directly from previously-calculated $R_p$ or $R_n$ macrocell values; i.e., values obtained by curve-fitting SPICE simulation outputs with exponential curves for given loading capacitances and input waveforms. The $R_p$ value is the resulting resistance when the output switches from low to high, and the $R_n$ value the resulting resistance when output switches from high to low. As described above, these values are stored in two-dimensional "lookup" tables indexed by input ramp time delay and loading capacitance. These macrocell values correspond to the circuit element coupling the culprit voltage source ($V_i$) with the culprit net.

Input ramp time delay for a culprit signal net may be estimated in any conventional manner using techniques wellknown in the art of circuit simulation. Such delay may be based upon conventional circuit parameters including total signal net capacitance (i.e., capacitance of all input pins, output pins and wire), output pin resistance and the switching threshold for each of the input pins on the net. Most of these values may be maintained in modeling library 108 of CAD system 100. Effective culprit loading capacitance ($C_i$) is calculated as described above (with respect to delay predictor 118) and can be retrieved from memory 104 of FIG. 1.

Upon calculating and retrieving the input ramp time and loading capacitance for a particular culprit signal net, effective resistance ($R_i$) is determined through use of the two-dimensional lookup tables described above. The time constant of the culprit net ($\tau_i$) may then be calculated by multiplying $C_i$ and $R_i$ together. In addition, as an alternative and preferred method, the estimated ramp time may be used directly to calculate $\tau_i$ through application of RC charge or discharge curve equations (i.e., using voltage levels corresponding to a time-constant period and associated ramp time to solve for $\tau_i$). The resulting values are stored in memory 104.

D. Crosstalk Noise Waveform

Referring again to FIG. 8, the noise appearing at node 800 (i.e., crosstalk noise waveform or $v_{XTm}(t)$) generated by culprit voltage waveform 806 (i.e., the $m^{th}$ culprit or $v_{xm}(t)$) may be defined in the s-domain by equations (18) and (19).

$$V_{XTm}(s) = V_{xm}(s) \cdot \frac{sR_vC_{cm}}{1 + sR_v(C_V + C_{cT})} \tag{18}$$

where $$C_{cT} = \sum_i C_{ci} \tag{19}$$

In the foregoing equations, $C_{cT}$ is the sum of all the coupling capacitance.

Replacing $V_{xm}(s)$ with the expression derived earlier (see equation (3)), the crosstalk noise is then given by equation (20).

$$V_{XTm}(s) = \frac{V_{dd}}{s} \cdot \frac{1}{1 + sR_iC_i} \cdot \frac{sR_vC_{cm}}{1 + sR_v(C_V + C_{cT})} \tag{20}$$

Further, the corresponding time-domain waveform is given by equations (21) and (22).

$$v_{XTm}(t) = V_{dd} \cdot \frac{\tau_c}{\tau_i - \tau_T} \cdot (e^{-\frac{t}{\tau_i}} - e^{-\frac{t}{\tau_T}}) \tag{21}$$

when $\tau_i$-$\tau_T$ is not equal to zero, and $$v_{XTm}(t) = V_{dd} \cdot \frac{\tau_c}{\tau_i^2} \cdot t \cdot e^{-\frac{t}{\tau_i}} \tag{22}$$

when $\tau_i$-$\tau_T$ is equal to zero, where $\tau_i = R_iC_i$, $\tau_c = R_vC_{cm}$, and $\tau_T = R_v(C_v + C_{cT})$.

Note that regardless of the sign of $\tau_i$-$\tau_T$, the crosstalk waveform $v_{XTm}(t)$ is always positive when the culprit switches from low to high.

Evaluating the equations given above, it can be shown that crosstalk noise increases with increasing $\tau_T/\tau_i$ ratio. This is intuitively correct since crosstalk is a capacitive coupling effect and the more the high frequency content the interfering source has, the higher the crosstalk noise will be. The amount of high frequency content can be determined by the quickness of the transition. A small culprit time constant $\tau_i$ means fast transition, thus, more high frequency content, and therefore higher crosstalk interference.

Based on equations (21) and (22), the peak of individual crosstalk noise can be determined by setting the derivative of $v_{XTm}(t)$ to zero and solving for the root of the equation. The resulting peak noise voltage for $v_{XTm}(t)$, identified as $\hat{v}_{XTm}(t)$, is defined by equations (23) and (24).

$$\hat{v}_{XTm} = (V_{dd}) \frac{\tau_c}{\tau_T} \cdot \left(\frac{\tau_T}{\tau_i}\right)^{\frac{\tau_i}{\tau_i - \tau_T}} \tag{23}$$

when $\tau_i$-$\tau_T$ is not equal to zero, and $$\hat{V}_{XTm} = (V_{dd}) \frac{\tau_c}{\tau_T} \cdot e^{-1} \tag{24}$$

when $\tau_i$-$\tau_T$ is equal to zero.

Again, it is observed that the peak of the crosstalk noise increases with increasing $\tau_T/\tau_i$ ratio. In addition, the peak is linearly proportional to $\tau_c$ and therefore is linearly proportional to the coupling capacitance $C_c$.

The peak of the total crosstalk noise can be computed by finding the peak of $v_{xTotal}(t)$, as defined in equation (5). This, however, involves intensive computation. To reduce computation time, it is preferred to estimate the peak using an absolute-worst-case bound or two-standard-deviation (2-SD) bound, as discussed below.

E. Model Accuracy

To verify accuracy, results computed by the foregoing crosstalk model (i.e., peak crosstalk noise) were compared with those simulated by SPICE on a hypothetical victim circuit subjected to one or more hypothetical culprit circuits. Both the circuit configurations and variables used in the following analysis have been selected merely for illustration. One having ordinary skill in the art would recognize that the values of the variables will change based on a number of factors including circuit configuration, relative proximity of victim and culprit(s), and implementing technology. As discussed below, all crosstalk model computations were within ten percent of the SPICE simulation results.

Figure 12:
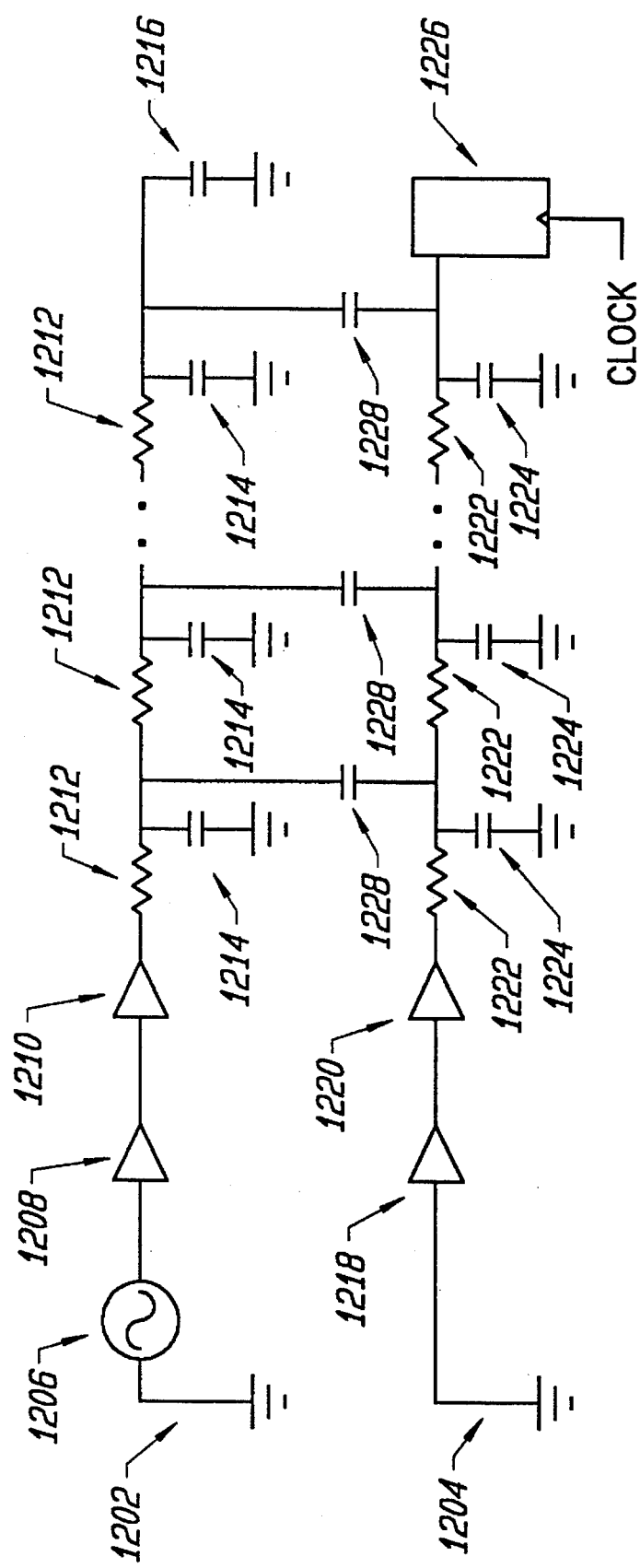
FIG. 12 illustrates a distributed RC circuit used in SPICE simulation.

FIG. 12 illustrates a one-culprit configuration used to verify crosstalk-model accuracy. Culprit 1202 and victim 1204, as shown in FIG. 12, both incorporate the distributed RC model described above. Culprit 1202 includes voltage source 1206 connected to inverter 1208 which is, in turn, connected to buffer 1210. A series of interconnected distributed resistors 1212 and capacitors 1214 is connected to buffer 1210 and loading capacitor 1216. Victim 1204 includes inverter 1218 connected to inverter 1220. A series of interconnected distributed resistors 1222 and capacitors 1224 is connected to inverter 1220 and flip flop 1226. Culprit 1202 and victim are coupled to each other through coupling capacitors 1228.

To evaluate crosstalk noise accuracy in the circuit of FIG. 12, the following variables were calculated by SPICE:

Victim source resistance: 320 ohms (rounded)

Victim loading capacitance: $0.042 \times 10^{-12}$ f

Culprit time constant ($\tau_i$): $0.18 \times 10^{-9}$

Additionally, the following variables were defined by the user:

Victim wire resistance (Rw): 36 ohms

Culprit i to victim coupling capacitance ($C_c$): $145 \times 10^{-15}$ f

Victim ground capacitance (Cv): $78 \times 10^{-15}$ ohms

Total coupling capacitance from i culprits ($C_{cT}$): $145 \times 10^{-15}$ f

Time step (tstep): $0.05 \times 10^{-9}$

Steps (m): 0 to 50

Number of culprits (i): 1

Finally, equations (25) (26) and (27) were used to describe the crosstalk response:

$$\tau_c(R_w, C_c) = (R_w + 320)C_c \tag{25}$$

$$\tau_T(R_w, C_v, C_{cT}) = (R_w + 320)(C_{cT} + C_v + 0.042 \times 10^{-12}) \tag{26}$$

$$Vx(m, R_w, C_c, C_v, C_{cT}, \tau_i) :=$$

$$5 \cdot \frac{\tau c(Rw, Cc)}{\tau i - \tau T(Rw, Cv, Cct)} \cdot (e^{-\frac{m \cdot tstep}{\tau i}} - e^{-\frac{m \cdot tstep}{\tau T(Rw, Cv, Cct)}}) \tag{27}$$

Figure 15:
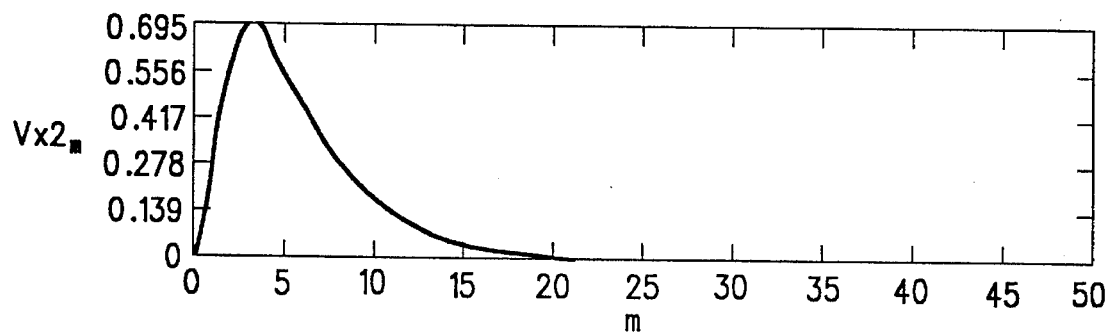
FIGS. 15, 17, 19, 21, and 23 illustrate output waveforms generated by a crosstalk model defined according to the principles of the invention.
Figure 16:
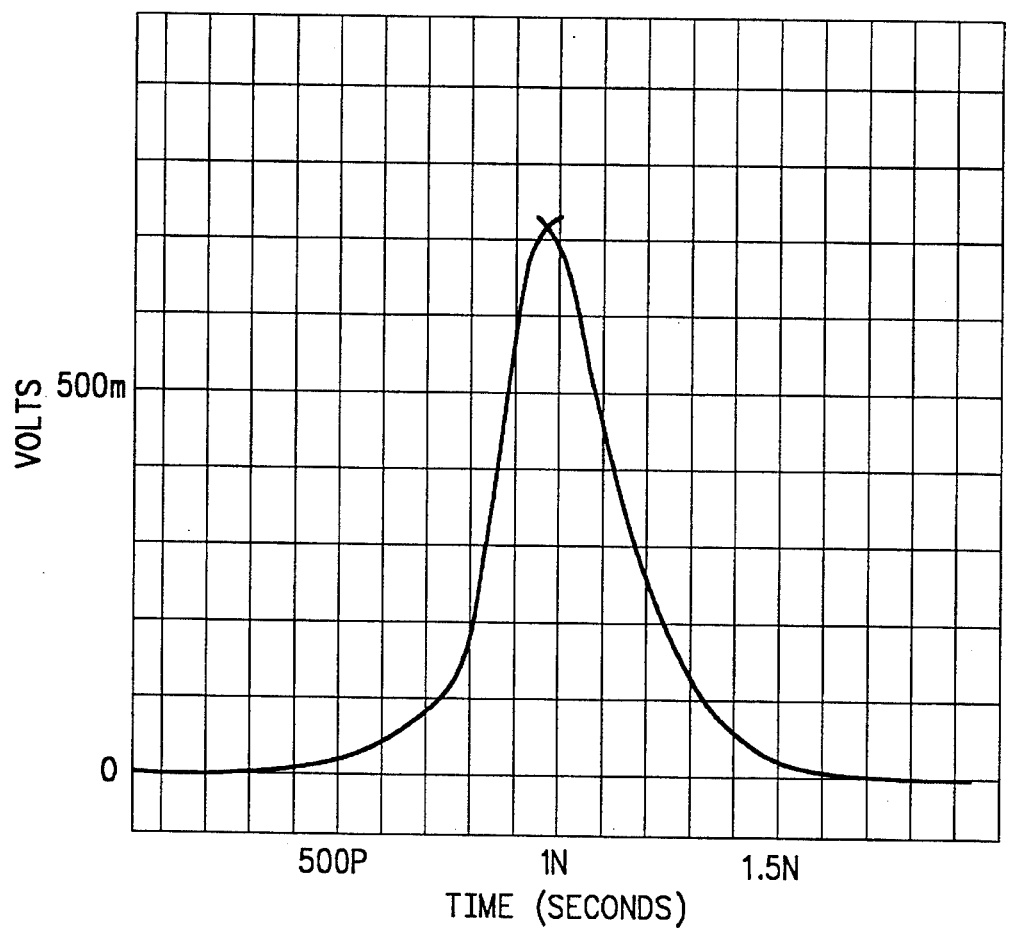
FIGS. 16, 18, 20, 22 and 24 illustrate output waveforms generated by SPICE simulation.

The resulting output waveform is illustrated in FIG. 15, where $Vx2_m = Vx(m, R_w, C_c, C_v, C_{cT}, \tau_i)$—based upon the foregoing values. The corresponding SPICE output waveform is provided in FIG. 16.

Figure 17:
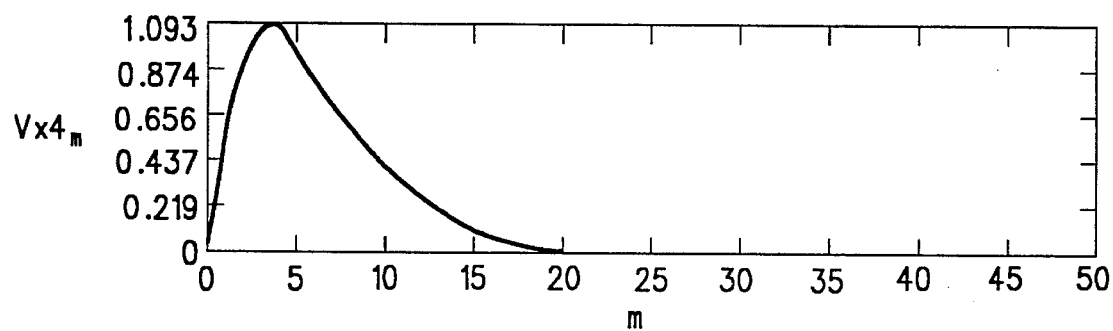
Figure 18:
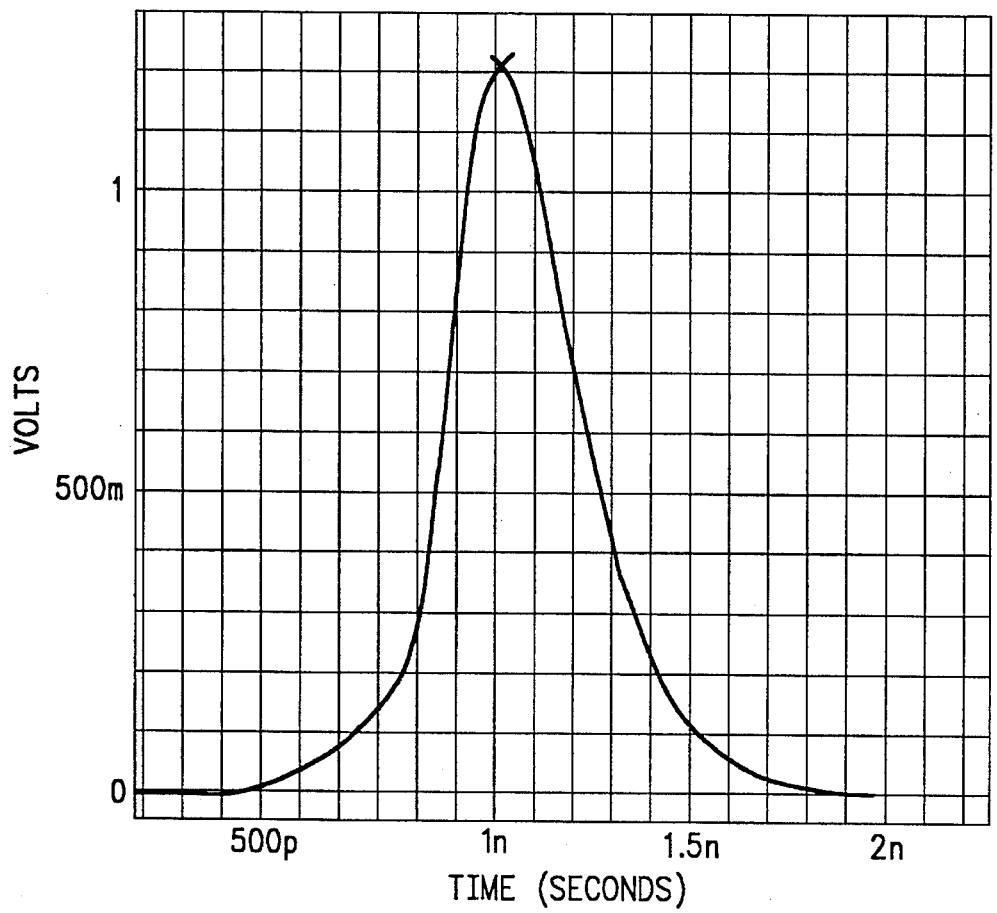

Similar comparative analysis was performed on circuits containing from two to five culprits (i.e., i=2 to 5). Using the same abbreviated equation as above for purposes of identification (i.e., $Vx\# = Vx(m, R_w, C_c, C_v, C_{cT}, \tau_i)$, the values employed in these multi-culprit circuits are as follows:

Two Culprits:

Culprit time constant $(\tau_i)$: $0.208 \times 10^{-9}$ $Vx4_m = Vx(m, 36, 140 \times 10^{-15}, 42 \times 10^{-15}, 280 \times 10^{-15}, \tau_i) + Vx(m, 36, 140 \times 10^{-15}, 42 \times 10^{-15}, 280 \times 10^{-15}, \tau_i)$ The resulting output waveform, identified as Vx4m, is illustrated in FIG. 17, and the corresponding SPICE output waveform is provided in FIG. 18.

Three Culprits:

Culprit time constant $(\tau_i)$: $0.198 \times 10^{-9}$ $$Vx6_m = Vx(m, 36, 46 \cdot 10^{-15}, 14 \cdot 10^{-15}, 148 \cdot 10^{-15}, \tau i) +$$
$$Vx(m, 36, 57 \cdot 10^{-15}, 14 \cdot 10^{-15}, 148 \cdot 10^{-15}, \tau i) +$$
$$Vx(m, 36, 45 \cdot 10^{-15}, 14 \cdot 10^{-15}, 148 \cdot 10^{-15}, \tau i)$$

Figure 19:
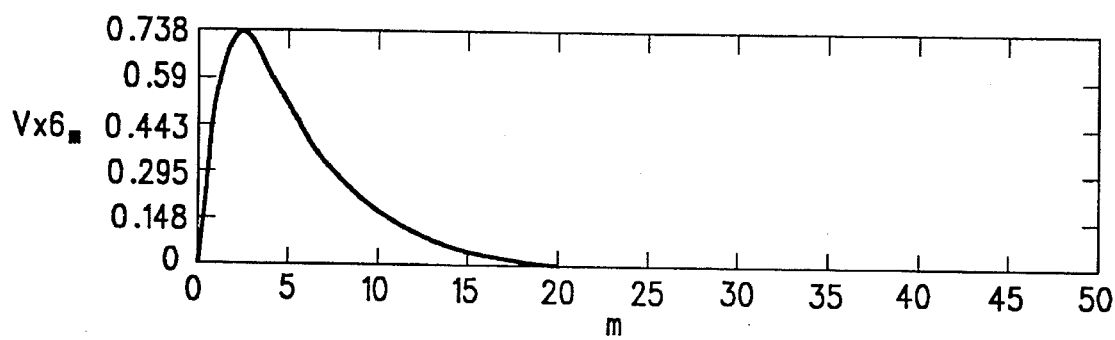
Figure 20:
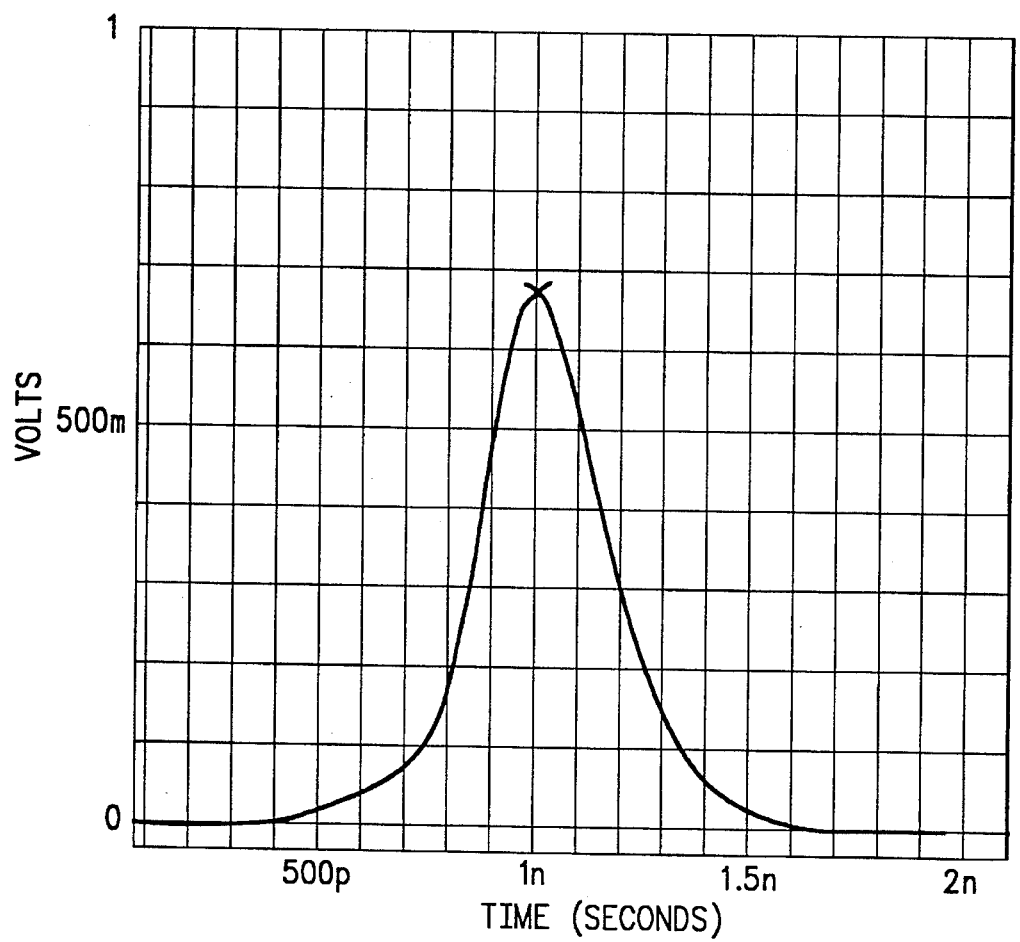

The resulting output waveform, identified as $Vx6_m$, is illustrated in FIG. 19, and the corresponding SPICE output waveform is provided in FIG. 20.

Four Culprits:

Culprit time constant $(\tau_i)$: $0.198 \times 10^{-9}$ $$Vx9-1_m = Vx(m, 46, 82 \cdot 10^{-15}, 143 \cdot 10^{-15}, 220 \cdot 10^{-15}, \tau i) +$$
$$Vx(m, 46, 82 \cdot 10^{-15}, 143 \cdot 10^{-15}, 220 \cdot 10^{-15}, \tau i)$$
$$Vx9-2_m = Vx(m, 46, 28 \cdot 10^{-15}, 143 \cdot 10^{-15}, 220 \cdot 10^{-15}, \tau i) +$$
$$Vx(m, 46, 28 \cdot 10^{-15}, 143 \cdot 10^{-15}, 220 \cdot 10^{-15}, \tau i)$$
$$Vx9_m = Vx9-1_m + Vx9-2_m$$

Figure 21:
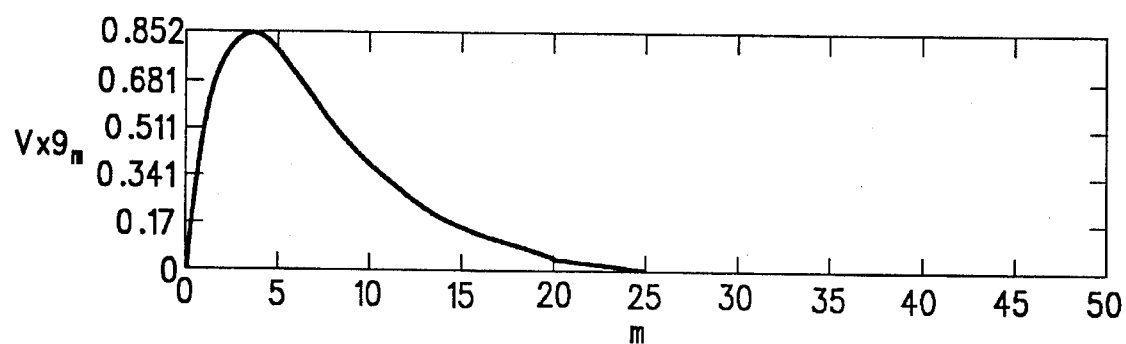
Figure 22:
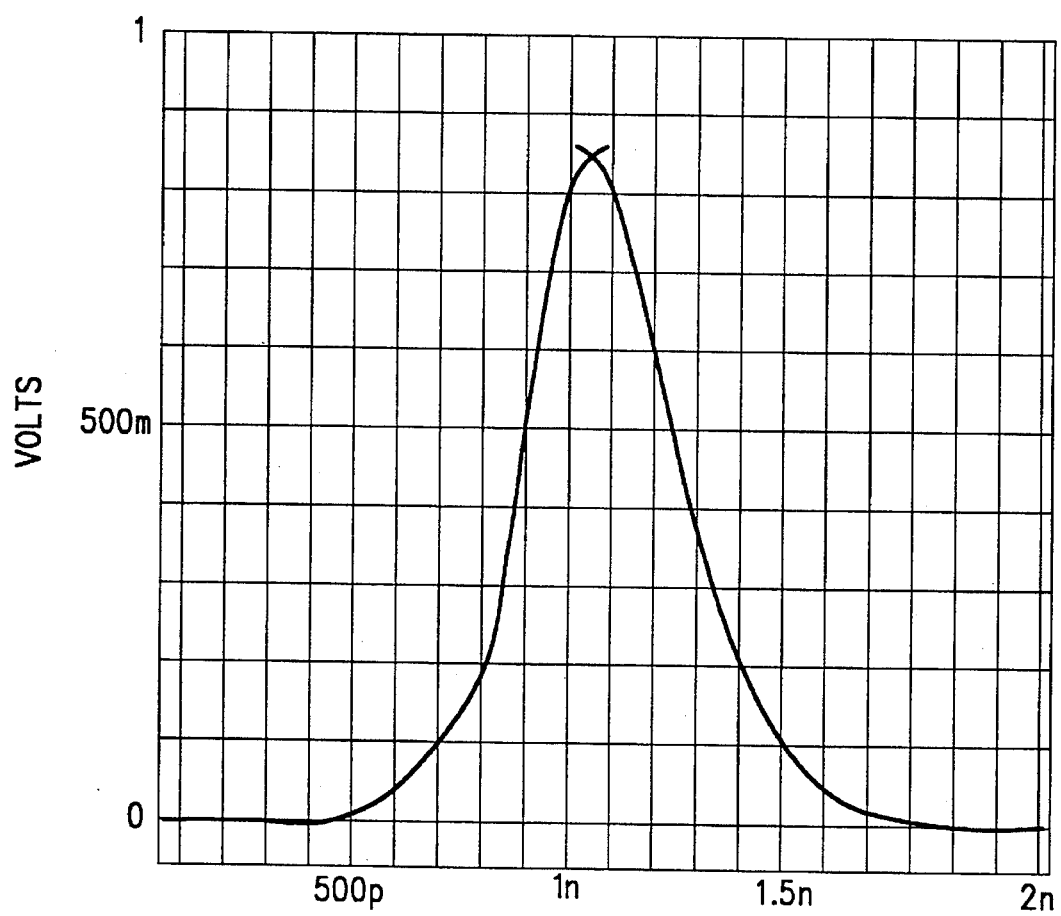

The resulting output waveform, identified as $Vx9_m$, is illustrated in FIG. 21, and the corresponding SPICE output waveform is provided in FIG. 22.

Five Culprits:

Culprit time constant $(\tau_i)$: $0.198 \times 10^{-9}$ $$Vx8-1_m = Vx(m, 36, 13 \cdot 10^{-15}, 2.1 \cdot 10^{-15}, 223 \cdot 10^{-15}, \tau i) +$$
$$Vx(m, 36, 38 \cdot 10^{-15}, 2.1 \cdot 10^{-15}, 223 \cdot 10^{-15}, \tau i) +$$
$$Vx(m, 36, 13 \cdot 10^{-15}, 2.1 \cdot 10^{-15}, 223 \cdot 10^{-15}, \tau i)$$
$$Vx8-2_m = Vx(m, 36, 79 \cdot 10^{-15}, 2.1 \cdot 10^{-15}, 223 \cdot 10^{-15}, \tau i) +$$
$$Vx(m, 36, 80 \cdot 10^{-15}, 2.1 \cdot 10^{-15}, 223 \cdot 10^{-15}, \tau i)$$
$$Vx8_m = Vx8-1_m + Vx8-2_m$$

Figure 23:
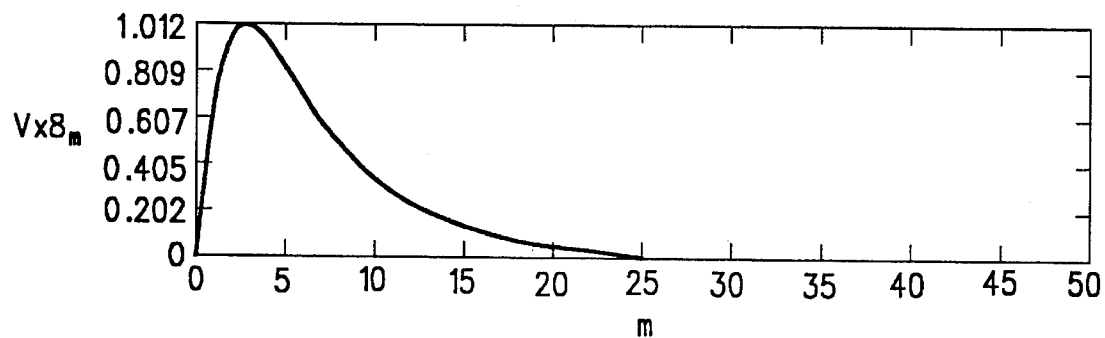
Figure 24:
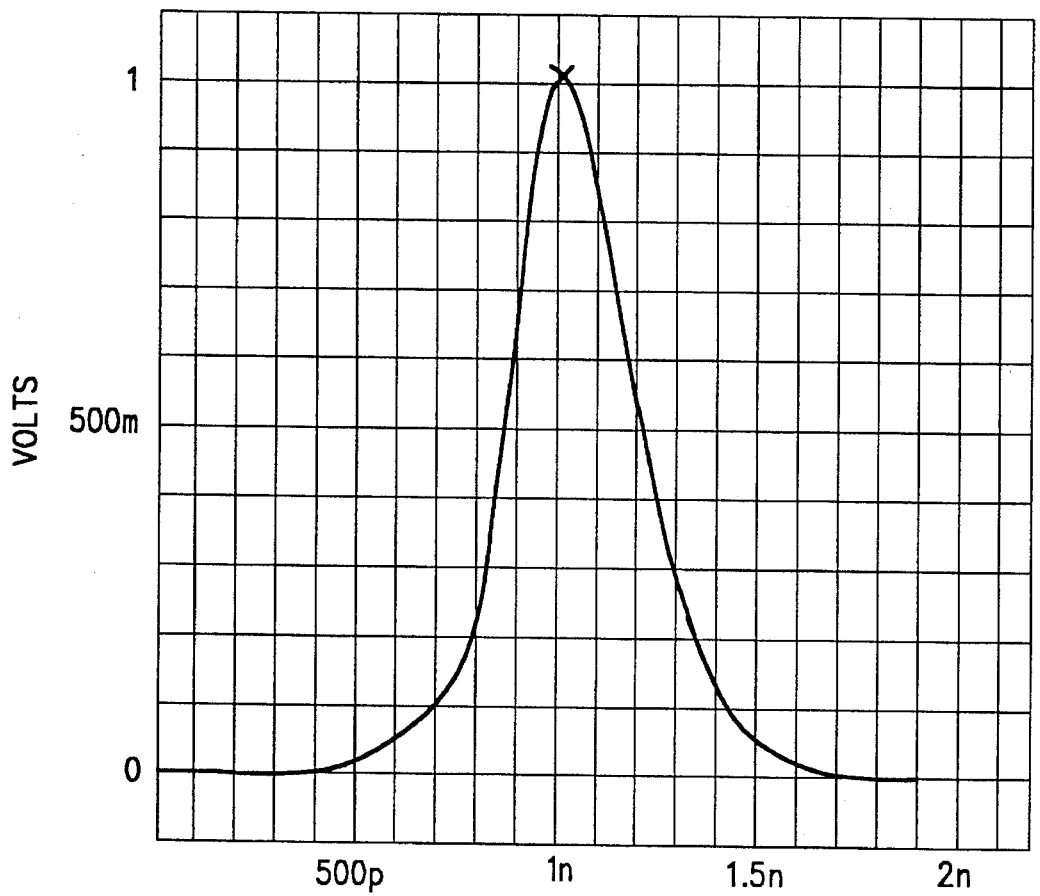

The resulting output waveform, identified as $Vx8_m$, is illustrated in FIG. 23, and the corresponding SPICE output waveform is provided in FIG. 24.

Table 1 summarizes the computed and simulated noise peaks for all five test cases. In each case, culprits were assumed to switch at the same time. As can be seen from the table, the error for each test case was within ten percent of SPICE simulation output.

TABLE 1

| Test Case | # of Culprit | SPICE Result (V) | Crosstalk Model (V) | % error |
|---|---|---|---|---|
| case 1 | 1 | 0.715 | 0.69 | 3.5% |
| case 2 | 2 | 1.219 | 1.10 | 9.7% |
| case 3 | 3 | 0.675 | 0.74 | 9.6% |
| case 4 | 4 | 0.855 | 0.85 | 5.8% |
| case 5 | 5 | 1.026 | 1.01 | 1.5% |

III. Crosstalk Estimation and False Logic Detection

Figure 13:
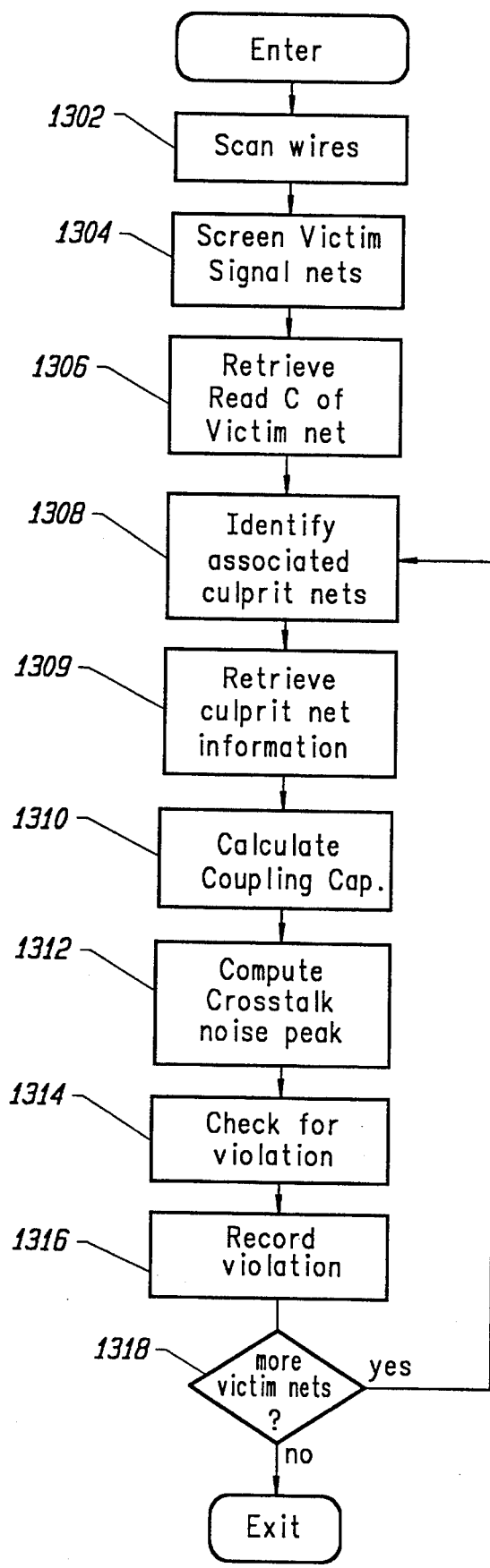
FIG. 13 is a flow chart of an embodiment of a crosstalk system operating according to the principles of the invention.

A process flow for the crosstalk system operating according to the principles of the present invention is shown in FIG. 13. This multi-step process is incorporated in the CAD system described above at block 208 in FIG. 2. In brief, the process methodically evaluates a circuit for crosstalk noise between culprit and victim signal nets. Detected noise is evaluated against predefined criteria to determine whether the noise is sufficiently strong to cause "false logic" (i.e., incorrect circuit performance) to occur.

Referring to FIG. 13, crosstalk analysis begins at block 1302 with the scanning of all wires contained in a circuit-design layout to identify signal nets. This scanning procedure is based on circuit connectivity; the signal net being a signal path, node or wire that connects two or more points (i.e., all points on a net are considered at the same voltage or logic level).

Each net identified at block 1302 is screened at block 1304 to identify those small fraction of nets that are most likely to have crosstalk violation (i.e., false logic) and need to be analyzed. Such screening results in more efficient operation by eliminating from consideration those nets unlikely to experience false logic. For example, victim nets with strong drives are unlikely to experience false logic since such nets are able to recover quickly after a crosstalk interference occurs, resulting in crosstalk noise of negligible duration. Similarly, victim nets with large loading capacitances are also unlikely to experience false logic since the noise on such nets will typically be of very low amplitude.

The basis for the screening criteria employed by the crosstalk system is illustrated in Table 2, which gives an example of the vulnerability of a flip flop (FD1)—implemented in one particular technology and using a 5 V power supply—to different noise pulses imposed at its clock input. This table is generated by feeding square pulses with different heights and widths directly to the clock input of FD1. Given a square noise, this table can be used to decide if the noise peak and its duration is large enough to cause the flip flop to switch state.

More specifically, Table 2 displays false-logic-noise height and width threshold pairs for 5 V flip-flop circuits implemented in a particular technology. The noise is a positive-going pulse, and the input of the flip flop is in a low state. False logic occurs only when the noise height and width pair falls above the curve defined by points given in this table. It can be seen that when a positive-going pulse is imposed on the input of this flip flop, which is initially in a low state, the flip flop will not switch state so long as (1) the noise peak is lower than a threshold voltage level (2.1 volts in this case) regardless of the noise duration, or (2) the positive-going pulse is shorter than a threshold duration (0.3 ns in this case), regardless of the voltage amplitude. Although the information in Table 2 is derived from a flip-flop macrocell, the crosstalk system applies this same data to all macrocells implemented in the same technology and using the same power-supply voltage level.

TABLE 2

| Noise Height (Volt) | Pulse Width (nano second) |
|---|---|
| 2.1 | 1.7 |
| 2.2 | 1.1 |
| 2.3 | 0.8 |
| 2.4 | 0.6 |
| 2.5 | 0.6 |
| 2.6 | 0.5 |
| 2.7 | 0.4 |
| 2.9 | 0.4 |
| Greater than 3.1 | 0.3 |

Drawing from the information contained in Table 2, a victim net implemented in the same technology and subjected to the same power-supply voltage level as FD1 must satisfy the following two criteria in order to be analyzed:

1. The loading capacitance must be less than 90% of the sum of the wire (to ground) capacitance and the coupling capacitance; and
2. The time constant must be greater than 0.3 nano seconds.

The first criteria is established based upon a simplified voltage divider reasoning. Ignoring the culprit and victim resistance and assuming that the coupling capacitance is three times the victim wire (to ground) capacitance, the crosstalk noise will always be less than 40% of $V_{dd}$, or 2.0 V (where $V_{dd}=5$ V) if the loading capacitance is no more than 90% of the total wire capacitance. This result is significant since, as illustrated in Table 2, 2.0 V falls below a minimum threshold voltage necessary to cause false logic in 5 V flip flop circuits—regardless of duration.

Figure 14:
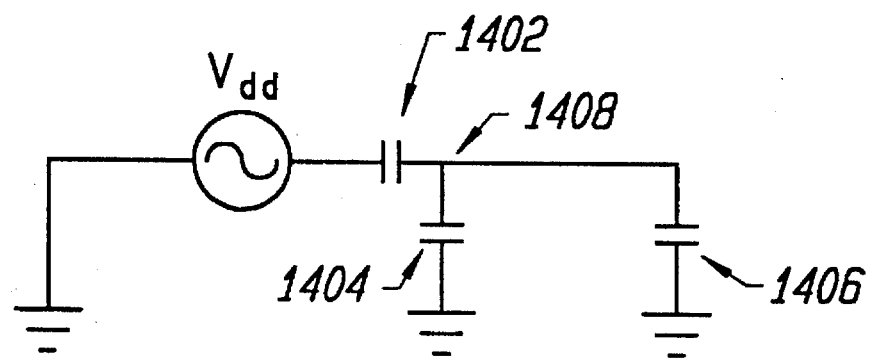
FIG. 14 illustrates a circuit model corresponding to a screening operation.

Exemplary circuit components are illustrated in FIG. 14, wherein capacitors 1402, 1404 and 1406 represent coupling capacitance ($C_c$), wire capacitance ($C_w$) and loading capacitance ($C_l$), respectively. Crosstalk noise at node 1408 (identified as $V^b_{XT}$) is defined by equation (28).

$$V^b_{XT} = V_{dd} \cdot \left( \frac{C_c}{C_w + C_l + C_c} \right) \quad (28)$$

Accordingly, if:

$$C_l = 0.9 \cdot 4 \cdot C_w = 0.9 \cdot \frac{4}{3} \cdot C_c$$

then:

$$V^{bound}_{XT} = V_{dd} \cdot \left( \frac{C_c}{C_w + C_l + C_c} \right) = V_{dd} \cdot \frac{3}{1 + 4 \cdot 0.9 + 3} = 1.97 \text{ V}$$

Based upon the values shown in Table 2, this crosstalk noise value (i.e., 1.97 V) in a 5 V flip-flop circuit should result in no false logic, regardless of duration.

The second criteria is again obtained from Table 2, which indicates that no false logic will occur regardless of a crosstalk noise peak so long as the pulse duration is less than 0.3 ns. Accordingly, the time constant of the victim signal net in this case must be greater than this limit.

As noted above, the values in Table 2 correspond to a particular power supply voltage and technology. Accordingly, the threshold voltage level will change for a different power supply voltage level. Similarly, the threshold duration may change for a different technology. While the specific values may change, the screening step in block 1304 of FIG. 13 remains the same. Specifically, the crosstalk system applies the foregoing two-part screening criteria to each signal net, identifying those nets warranting further analysis (i.e., nets most likely to experience false logic due to crosstalk noise).

After screening is complete, the effective resistance and loading capacitance of each screened signal net (i.e., victim signal net) is retrieved at block 1306 in FIG. 13. As discussed above, these values are calculated and stored in memory 104 of CAD system 100 through an application program, such as delay predictor 118 of FIG. 1. Accordingly, the crosstalk system retrieves these values from memory 104.

Figure 25A:
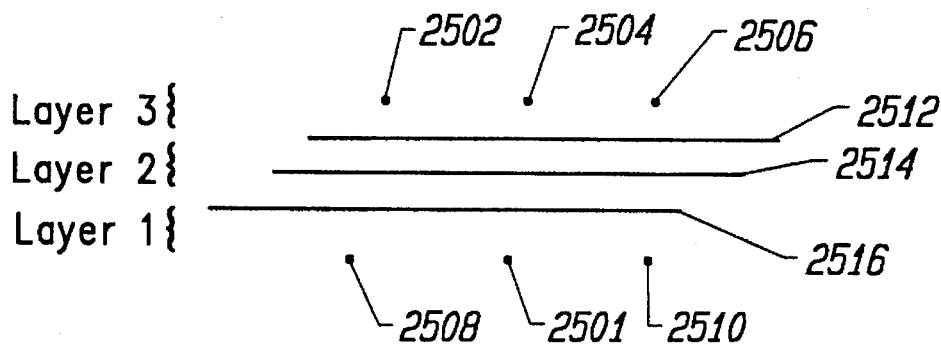
FIGS. 25A and 25B illustrate the relative disposition of wires in a three-layer metal technology.
Figure 25B:
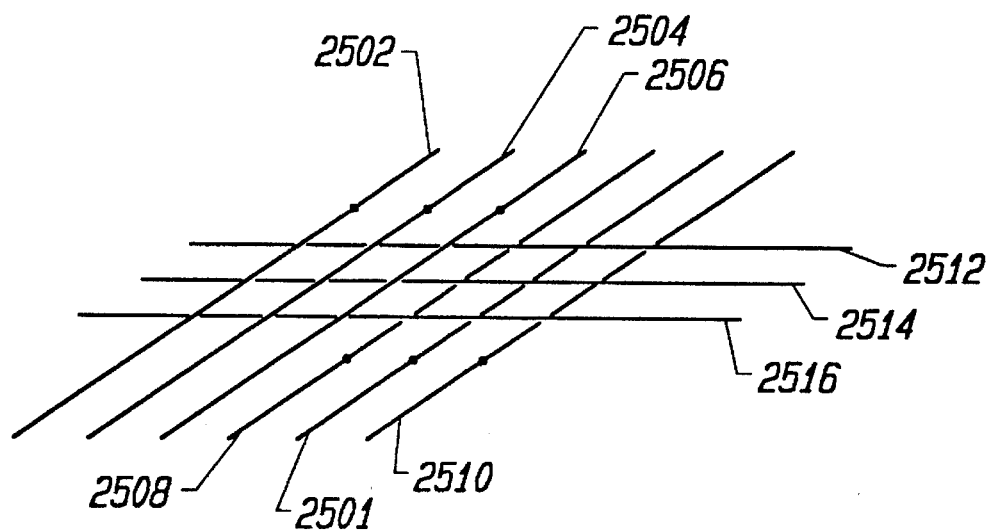

Once victim nets have been screened and component values retrieved from memory, associated culprit signal nets are identified in block 1308 of FIG. 13. Culprit signal nets are identified based solely upon proximity to victim nets. This distance is technology dependent. Each technology is subject to a set of "design rules" providing, among other things, minimum distances between wires, vias and contacts as well as minimum distances from wires to vias. This latter rule is the preferred standard by which to identify "associated" culprit nets horizontally disposed from victim nets (i.e., on the same semiconductor layer). Referring to FIGS. 25A and 25B, which show a three-layer metal technology, nets 2508 and 2510 are sufficiently close to victim net 2501 to qualify as culprit nets (i.e., the distance between nets is less than some design-rule standard).

Further, in multi-layer metal technologies, culprit nets may also be vertically disposed from a victim net (i.e., on different semiconductor layers). Referring again to FIGS. 25A and 25B, nets 2502, 2504 and 2506 are disposed on the top layer of a three-layer metal technology. These nets run parallel to victim net 2501 located in the bottom layer of the three-layer technology. (The middle layer contains nets 2512, 2514 and 2516 which run perpendicular to victim net 2501.) The preferred embodiment of the present invention identifies those nets separated by no more than one metal layer and disposed approximately directly above lie, within a predefined horizontal distance) and parallel to a victim net as being culprit nets. Referring to FIGS. 25A and 25B, nets 2502, 2504 and 2506 satisfy this criteria.

Upon identifying all culprit signal nets associated with a particular victim, crosstalk system retrieves the effective loading capacitance and resistance of each culprit net from memory 104 in accordance with block 1309 in FIG. 13. These values enable the calculation of a time constant ($\tau_i$) for each culprit signal net. Alternatively and preferably, crosstalk system may directly retrieve $\tau_i$ for each culprit signal net (derived from estimated ramp time as described above) and associated effective loading capacitance.

The crosstalk system also calculates the coupling capacitance present between associated culprit nets and a victim net in accordance with block 1310 in FIG. 13. Like signal-net wire capacitance described above, predefined coupling capacitance per-unit-length values are held in library 108 of CAD system 100 (FIG. 1). Coupling capacitance is determined by multiplying a predefined library value by the distance over which two wires (from a victim and associated culprit signal net) run in parallel. The predefined value takes into account such factors as the proximity and composition of the parallel wires. Alternatively, coupling capacitance could be measured empirically, estimated through circuit simulation with values stored in memory 104, or calculated through another application on CAD system 100 such as delay predictor 118.

Upon the completion of blocks 1302 through 1310 of FIG. 13, all necessary resistive and capacitive values and/or time constants are retrieved for a victim signal net and selected culprit signal nets. Accordingly, sufficient information is now available to estimate the peak of total crosstalk noise generated by selected culprit signal nets identified in block 1308, in accordance with block 1312 in FIG. 13.

The peak of individual crosstalk noise can be determined through application of equations (23) and (24) (derived from equations (21) and (22)), as discussed above. While the peak of total crosstalk noise can be computed by finding the peak of $v_{xTtotal}(t)$, as defined in equation (5), such computation is intensive. To reduce computation time, the crosstalk system estimates the peak of total crosstalk noise using an absolute-worst-case bound, two-standard-deviation (2-SD) bound, or a percentage-based bound.

The absolute worst case bound of the peak noise is given by summing the peaks of the individual culprit noise. This bound will be reached only in the event that all the culprits switch at the same time and have exactly the same time constant $\tau_i$. This bound is defined by equation (29).

$$V_{XTtotal} = \sum_m V_{XTm} \quad (29)$$

Alternatively, since culprits may not all switch in the same direction, some of them may not even switch, and all the peaks are not likely to occur at exactly the same time, an alternative bound of the crosstalk peak is the 2-SD bound, which is defined by equation (30).

$$V_{XTtotal} = 2 \cdot \sqrt{\sum_m V_{XTm}^2} \quad (30)$$

To reduce computation time, the peak of the total crosstalk noise may be estimated as the sum of the peaks of those crosstalk signals whose coupling capacitances are among the top 10% of all the culprits, with the minimum number of peaks used in the summation being two. In operation, a percentage would be selected prior to block 1308 of FIG. 13. The process of selecting culprits based on the percentage would be performed between blocks 1310 and 1312 of FIG. 13. The peak would then be calculated in block 1312.

Aside from determining peak crosstalk noise, equations (21) and (22) may also be used to calculate the duration of such noise. This calculation, however, requires a high degree of computation. Therefore, to reduce computation time the crosstalk system uses a false-logic detection method that eliminates the need for calculating noise duration. Accordingly, violation-detection processing may begin upon obtaining the peak of total crosstalk noise.

Referring to block 1314 of FIG. 13, violation detection is carried out by comparing the peak of total crosstalk noise (determined using one of the three methods described above) with a predefined voltage threshold. False logic (i.e., improper circuit operation) will occur in the screened victim signal net if the predefined threshold is exceeded.

As noted above with respect to Table 2, when a positive-going pulse is imposed on the input of a 5 V-circuit flip-flop originally in a low state, the flip flop will not switch state so long as the noise peak is lower then the threshold voltage level (2.1 volts in this case) regardless of the noise duration. Based upon this concept of an extreme threshold value, only two peak voltage thresholds (for low-to-high transition and high-to-low transition respectively) need to be used as the failure criteria for any circuit element associated with a victim net; a false logic being defined as occurring when the noise exceeds such thresholds. For example, with respect to macrocells using a 5 V power supply and implemented in the technology of Table 2, low-to-high and high-to-low threshold values have been defined as 2.0 V.

Should a false logic violation be detected, the violation is recorded in accordance with block 1316 in FIG. 13. After which, control is returned to block 1308 to process any remaining victim signal nets via decision block 1318. Alternatively, where all nets have been analyzed, crosstalk analysis is complete, and control is returned to the main process flow displayed in FIG. 2. Should the crosstalk system detect any false logic, the affected signal nets of the subject design are re-routed, and the design is re-analyzed pursuant to blocks 210, 212, 206 and 208 of FIG. 2.

While the above is a complete description of the preferred embodiment of the invention, various modifications, alternatives and equivalents may be used. Therefore, the above description should not be taken as limiting the scope of the invention which is defined by the appended claims.

What is claimed is:

1. A computer aided design (CAD) system for modeling and estimating crosstalk noise and detecting false logic, said system comprising:

a user interface for entering circuit schematic information into the CAD system, said circuit schematic information defining circuit elements and a plurality of circuit nets, said plurality of circuit nets including a victim signal net and a culprit signal net;

a memory, coupled to said user interface for storing said circuit schematic information and a computer program; and a processor directed by said computer program, coupled to said memory, for calculating peak crosstalk noise ($\hat{v}_{XTm}$) on said victim signal net generated by said culprit signal net, wherein said peak crosstalk noise is defined as:

$$\hat{V}_{XTm} = (V_{dd}) \frac{\tau_c}{\tau_T} \cdot \left( \frac{\tau_T}{\tau_i} \right)^{\frac{\tau_i}{\tau_i - \tau_T}}$$

when $\tau_i - \tau_T$ is not equal to zero, and $$V_{XTm} = (V_{dd}) \frac{\tau_c}{\tau_T} \cdot e^{-1}$$

when $\tau_i - \tau_T$ is equal to zero, where $\tau_c = R_v C_{cm}$, $\tau_T = R_v(C_i + C_{cT})$ and where $\tau_i$ represents a time constant of said culprit signal net, $C_i$ represents an effective loading capacitance of said culprit signal net, $R_v$ represents an effective resistance of said victim signal net, $C_v$ represents an effective loading capacitance of said victim signal net, $C_c$ represents coupling capacitance between said victim signal net and said culprit signal net, $C_{cT}$ represents a sum of all coupling capacitance related to said victim signal net, $V_{dd}$ represents a power supply voltage; and wherein said processor compares said peak crosstalk noise with a previously-defined peak-voltage threshold value and detects false logic when said peak crosstalk noise exceeds said threshold value.

2. The CAD system of claim 1 wherein said processor re-routes said victim signal net in response to said false logic.

3. A computer aided design (CAD) system for modeling and estimating crosstalk noise and detecting false logic, said system comprising:

a computer program directing said system comprising:

means for entering circuit schematic information into the CAD system, said circuit schematic information defining circuit elements and a plurality of circuit nets, said plurality of circuit nets including a victim signal net and a culprit signal net;

means for approximating resistance and capacitance of said victim signal net as an effective victim resistance and effective victim loading capacitance, respectively;

means for approximating capacitance of said culprit signal net as an effective culprit loading capacitance;

means for calculating a time constant of said victim signal net;

means for calculating a peak crosstalk noise ($\hat{v}_{XTm}$) on said victim signal net generated by said culprit signal net, wherein said peak crosstalk noise is defined as:

$$\hat{V}_{XTm} = (V_{dd}) \frac{\tau_c}{\tau_T} \cdot \left( \frac{\tau_T}{\tau_i} \right)^{\frac{\tau_i}{\tau_i - \tau_T}}$$

when $\tau_i\text{-}\tau_T$ is not equal to zero, and $$V_{XTm} = (V_{dd}) \frac{\tau_c}{\tau_T} \cdot e^{-1}$$

when $\tau_i\text{-}\tau_T$ is equal to zero, where $\tau_c = R_v C_{cm}$, $\tau_T = R_v(C_i + C_{cT})$ and where $\tau_i$ represents said time constant of said culprit signal net, $C_i$ represents said effective culprit loading capacitance, $R_v$ represents said effective victim resistance, $C_v$ represents said effective victim loading capacitance, $C_c$ represents coupling capacitance between said victim signal net and said culprit signal net, $C_{cT}$ represents a sum of all coupling capacitance related to said victim signal net; and means for comparing said peak crosstalk noise with a previously-defined peak-voltage threshold value and detecting false logic when said peak crosstalk noise exceeds said threshold value.

4. The CAD system of claim 3 further comprising a means for re-routing said victim signal net in response to said false logic.

5. The CAD system of claim 3 further comprising a means for defining crosstalk noise on said victim signal net generated by said culprit signal net as:

$$V_{XTm}(t) = V_{dd} \cdot \frac{\tau_c}{\tau_i - \tau_T} \cdot \left( e^{-\frac{t}{\tau_i}} - e^{-\frac{t}{\tau_T}} \right)$$

when $\tau_i\text{-}\tau_T$ is not equal to zero, and $$V_{XTm}(t) = V_{dd} \cdot \frac{\tau_c}{\tau_i^2} \cdot t \cdot e^{-\frac{t}{\tau_i}}$$

when $\tau_i\text{-}\tau_T$ is equal to zero.

6. In a computer aided design (CAD) system having a processor and a memory, a method for detecting false logic in a signal net due to crosstalk noise comprising the steps of:

entering circuit schematic information into the CAD system to be stored in the memory, said circuit schematic information defining circuit elements and a plurality of signal nets;

the processor determining a coupling capacitance between pairs of signal nets included within said plurality of signal nets, wherein a first signal net of said pairs is a victim signal net and a second signal net of said pairs is a culprit signal net;

the processor approximating resistance and capacitance of each victim signal net of said plurality of signal nets as an effective victim resistance and effective victim loading capacitance, respectively;

the processor approximating capacitance of each culprit signal net of said plurality of signal nets as an effective culprit loading capacitance;

the processor retrieving a selected effective victim resistance and a selected effective victim loading capacitance for a selected victim signal net;

the processor calculating time constants associated with a set of culprit signal nets capacitively coupled to said selected victim signal net; and the processor calculating a total peak crosstalk noise on said selected victim signal net generated by said set of culprit signal nets, wherein peak crosstalk noise on said victim signal net caused by one culprit signal net included within said defined set of culprit signal nets is determined through a peak crosstalk relationship, said peak crosstalk relationship being defined as:

$$\hat{V}_{XTm} = (V_{dd}) \frac{\tau_c}{\tau_T} \cdot \left( \frac{\tau_T}{\tau_i} \right)^{\frac{\tau_i}{\tau_i - \tau_T}}$$

when $\tau_i\text{-}\tau_T$ is not equal to zero, and $$V_{XTm} = (V_{dd}) \frac{\tau_c}{\tau_T} \cdot e^{-1}$$

when $\tau_i\text{-}\tau_T$ is equal to zero, where $\tau_c = R_v C_{cm}$ and $\tau_T = R_v(C_i + C_{cT})$, and where $\tau_i$ represents a time constant and $C_i$ represents an effective culprit loading capacitance associated with said one culprit signal net, $R_v$ represents said selected effective victim resistance, $C_v$ represents said selected effective victim loading capacitance, $C_c$ represents a coupling capacitance between said one culprit signal net and said selected victim signal net, $C_{cT}$ represents a sum of all coupling capacitance between said defined set of culprit signal nets and said selected victim signal net and $V_{dd}$ represents a power supply voltage.

7. The method of claim 6 wherein said step of calculating a total peak crosstalk noise further comprises the steps of:

determining a peak value of crosstalk noise caused by each culprit signal net included within said set of culprit signal nets through said peak crosstalk relationship, wherein individual $\tau_i$ and $C_i$ are associated with said each culprit signal net, resulting in a plurality of peak values; and summing said plurality of peak values to create a total peak crosstalk noise.

8. The method of claim 6 wherein said step of calculating a peak value further comprises the steps of:

determining a peak value of crosstalk noise caused by each culprit signal net included within said set of culprit signal nets through said peak crosstalk relationship, wherein individual $\tau_i$ and $C_i$ are associated with said each culprit signal net, resulting in a plurality of peak values; and calculating a two standard-deviation value based upon said plurality of crosstalk noise peak values to create a total peak crosstalk noise.

9. The method of claim 6 further comprising the step of defining crosstalk noise on said victim signal net caused by said one culprit signal net as:

$$V_{XTm}(t) = V_{dd} \cdot \frac{\tau_c}{\tau_i - \tau_T} \cdot \left( e^{-\frac{t}{\tau_i}} - e^{-\frac{t}{\tau_T}} \right)$$

when $\tau_i\text{-}\tau_T$ is not equal to zero, and $$V_{XTm}(t) = V_{dd} \cdot \frac{\tau_c}{\tau_i^2} \cdot t \cdot e^{-\frac{t}{\tau_i}}$$

when $\tau_i\text{-}\tau_T$ is equal to zero.

10. The method of claim 7 further comprising the steps of:

comparing said total peak crosstalk noise with a previously-defined peak-voltage threshold value; and detecting false logic when said total peak crosstalk noise exceeds said threshold value.

11. The method of claim 7 further comprising the steps of:

comparing said total peak crosstalk noise with a previously-defined peak-voltage threshold value;

comparing a pulse width of said total peak crosstalk noise with a previously-defined time threshold value; and detecting false logic when said total peak crosstalk noise and said pulse width exceed said peak-voltage threshold value and said time threshold value, respectively.

12. The method of claim 10 further comprising the step of:
re-routing said selected victim signal net in response to said false logic.

13. The method of claim 10 further comprising the step of:
screening said victim signal nets of said pairs of signal nets to identify those victim nets most likely to experience false logic.

14. The method of claim 13 wherein said step of screening identifies those victim nets with (i) a loading capacitance less than a predefined percentage of a summation of wire capacitance and coupling capacitance and (ii) an RC time constant greater than a predetermined time duration.

15. The method of claim 13 wherein said step of approximating resistance and capacitance of each victim signal net comprises the steps of:
approximating a plurality of distributed resistors and capacitors in said each signal net as a lumped resistor and lumped capacitor, respectively; and
incorporating said lumped resistor and lumped capacitor into said effective victim resistance and effective victim loading capacitance, respectively.

16. A computer program product for modeling and estimating crosstalk noise and detecting false logic, comprising:
computer readable code that receives as input circuit schematic information, said circuit schematic information defining circuit elements and a plurality of circuit nets, said plurality of circuit nets including a victim signal net and a culprit signal net;
computer readable code that approximates resistance and capacitance of said victim signal net as an effective victim resistance and effective victim loading capacitance, respectively;
computer readable code that approximates capacitance of said culprit signal net as an effective culprit loading capacitance;
computer readable code that calculates a time constant of said victim signal net;
computer readable code that calculates a peak cross-talk noise ($\hat{V}_{XTm}$) on said victim signal net generated by said culprit signal net, wherein said peak crosstalk noise is defined as:

$$\hat{V}_{XTm} = (V_{dd}) \frac{\tau_c}{\tau_T} \cdot \left(\frac{\tau_T}{\tau_i}\right)^{\frac{\tau_i}{\tau_i - \tau_T}}$$

when $\tau_i - \tau_T$ is not equal to zero, and $$V_{XTm} = (V_{dd}) \frac{\tau_c}{\tau_T} \cdot e^{-1}$$

when $\tau_i - \tau_T$ is equal to zero, where $\tau_c = R_v C_{cm}$, $\tau_T = R_v(C_{i+C\ cT})$ and where $\tau_i$ represents said time constant of said culprit signal net, $C_i$ represents said effective culprit loading capacitance, $R_v$ represents said effective victim resistance, $C_v$ represents said effective victim loading capacitance, $C_c$ represents coupling capacitance between said victim signal net and said culprit signal net, $C_{cT}$ represents a sum of all coupling capacitance related to said victim signal net;

computer readable code that compares said peak crosstalk noise with a previously-defined peak-voltage threshold value and detecting false logic when said peak crosstalk noise exceeds said threshold value; and a computer storage medium that stores said computer readable codes as a computer program.

17. The computer program product of claim 16 further comprising computer readable code that re-routes said victim signal net in response to said false logic.

18. The computer program product of claim 16 further comprising computer readable code that defines crosstalk noise on said victim signal net generated by said culprit signal net as:

$$V_{XTm}(t) = V_{dd} \cdot \frac{\tau_c}{\tau_i - \tau_T} \cdot (e^{-\frac{t}{\tau_i}} - e^{-\frac{t}{\tau_T}})$$

when $\tau_i - \tau_T$ is not equal to zero, and $$V_{XTm}(t) = V_{dd} \cdot \frac{\tau_c}{\tau_i^2} \cdot t \cdot e^{-\frac{t}{\tau_i}}$$

when $\tau_i - \tau_T$ is equal to zero.

* * * * *